US008817538B2

(12) United States Patent
Itagaki et al.

(10) Patent No.: US 8,817,538 B2
(45) Date of Patent: Aug. 26, 2014

(54) NONVOLATILE SEMICONDUCTOR MEMORY DEVICE AND METHOD FOR ERASING DATA THEREOF

(75) Inventors: Kiyotaro Itagaki, Naka-gun (JP); Kunihiro Yamada, Yokkaichi (JP); Yoshihisa Iwata, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 86 days.

(21) Appl. No.: 13/493,370

(22) Filed: Jun. 11, 2012

(65) Prior Publication Data
US 2012/0320698 A1 Dec. 20, 2012

(30) Foreign Application Priority Data

Jun. 14, 2011 (JP) ................................. 2011-132424

(51) Int. Cl.
*G11C 11/34* (2006.01)

(52) U.S. Cl.
USPC ............ 365/185.11; 365/185.17; 365/185.18; 365/185.23; 365/185.27; 365/185.28; 365/185.29; 365/185.33

(58) Field of Classification Search
USPC ............ 365/185.11, 185.17, 185.18, 185.23, 365/185.27, 185.28, 185.29, 185.33
See application file for complete search history.

(56) References Cited

U.S. PATENT DOCUMENTS

| 7,936,004 | B2 | 5/2011 | Kito et al. | |
|---|---|---|---|---|
| 8,107,286 | B2 * | 1/2012 | Itagaki et al. | 365/185.17 |
| 8,194,467 | B2 * | 6/2012 | Mikajiri et al. | 365/185.17 |
| 8,199,584 | B2 * | 6/2012 | Park | 365/185.17 |
| 8,320,182 | B2 * | 11/2012 | Kirisawa et al. | 365/185.17 |
| 8,339,856 | B2 * | 12/2012 | Iwata | 365/185.17 |
| 8,488,378 | B2 * | 7/2013 | Maeda | 365/185.17 |
| 8,514,627 | B2 * | 8/2013 | Itagaki et al. | 365/185.18 |
| 8,599,610 | B2 * | 12/2013 | Nawata | 365/185.17 |
| 2007/0252201 | A1 | 11/2007 | Kito et al. | |
| 2008/0310230 | A1 | 12/2008 | Kim et al. | |
| 2010/0038703 | A1 | 2/2010 | Fukuzumi et al. | |
| 2010/0118610 | A1 | 5/2010 | Katsumata et al. | |
| 2010/0172189 | A1 | 7/2010 | Itagaki et al. | |
| 2010/0207195 | A1 | 8/2010 | Fukuzumi et al. | |
| 2011/0051527 | A1 | 3/2011 | Kirisawa et al. | |
| 2011/0284947 | A1 | 11/2011 | Kito et al. | |
| 2011/0287597 | A1 | 11/2011 | Kito et al. | |
| 2012/0069663 | A1 | 3/2012 | Itagaki et al. | |

FOREIGN PATENT DOCUMENTS

| JP | 2007-266143 | 10/2007 |
|---|---|---|
| JP | 2008-310949 | 12/2008 |
| JP | 2009-146954 | 7/2009 |
| JP | 2010-45149 | 2/2010 |
| JP | 2010-118530 | 5/2010 |
| JP | 2010-161199 | 7/2010 |

* cited by examiner

*Primary Examiner* — Trong Phan
(74) *Attorney, Agent, or Firm* — Oblon, Spivak, McClelland, Maier & Neustadt, L.L.P.

(57) ABSTRACT

A control circuit is configured to set a drain-side select transistor and a source-side select transistor connected to a selected memory string to non-conductive states. The control circuit is configured to apply a first voltage to a non-selected word line connected to a gate of a non-selected memory cell in the selected memory string. The control circuit is configured to apply a second voltage to a selected word line connected to a gate of a selected memory cell in the selected memory string. The second voltage is smaller than the first voltage in an erasing operation.

18 Claims, 16 Drawing Sheets

US 8,817,538 B2

NONVOLATILE SEMICONDUCTOR MEMORY DEVICE AND METHOD FOR ERASING DATA THEREOF

CROSS-REFERENCE TO RELATED APPLICATIONS

This application is based upon and claims the benefit of priority from the prior Japanese Patent Application No. 2011-132424, filed on Jun. 14, 2011, the entire contents of which are incorporated herein by reference.

FIELD

Embodiments described herein relate to a nonvolatile semiconductor memory device in which data is electrically rewritable and a method for erasing the data.

BACKGROUND

In terms of improvement in bit density of a nonvolatile semiconductor memory device such as a NAND-type flash memory, stacking of memory cells is desired since a miniaturizing technique is about to reach the limit. As an example thereof is proposed a stacked NAND-type flash memory constructing memory transistors with use of vertical transistors. The stacked NAND-type flash memory has a memory string containing a plurality of memory transistors connected in series in a stacking direction and selected transistors provided on both ends of the memory string.

In this stacked NAND-type flash memory, for the purpose of decreasing a circuit area of a peripheral circuit such as a row decoder, a structure in which a plurality of memory strings arranged in a matrix form are connected in common to one word line is adopted. The plurality of memory strings sharing the word line constitute a memory block, which is a minimum unit at the time of data erasure. Thus, in the stacked NAND-type flash memory, as the stacking number increases, the size of one memory block increases, which causes the minimum unit for data erasure to be larger. Making the minimum unit for data erasure smaller substantially means decreasing a data storage capacity, which is not favorable. Accordingly, development of a stacked flash memory enabling only a part of memory cells in one memory block to be erased selectively is desired.

BRIEF DESCRIPTION OF THE DRAWINGS

FIG. 4 is a top view illustrating a word line conductive layer 41a.

DETAILED DESCRIPTION

A nonvolatile semiconductor memory device according to an aspect comprises a semiconductor substrate, a memory cell array, a plurality of word lines, a bit line, a source line, a drain-side select transistor, a source-side select transistor, and a control circuit. The memory cell array has a memory string containing a plurality of memory cells. The memory cells are stacked on the semiconductor substrate. The plurality of word lines are connected to the plurality of memory cells. The bit line is electrically connected to one end of the memory string. The source line is electrically connected to the other end of the memory string. The drain-side select transistor is provided between one end of the memory string and the bit line. The source-side select transistor is provided between the other end of the memory string and the source line. The control circuit is configured to control voltages to be applied to the memory string, the plurality of word lines, the bit line, and the source line. The control circuit is configured to set the drain-side select transistor and the source-side select transistor connected to a selected memory string to non-conductive states. The control circuit is configured to apply a first voltage to a non-selected word line connected to a gate of a non-selected memory cell in the selected memory string. The control circuit is configured to apply a second voltage to a selected word line connected to a gate of a selected memory cell in the selected memory string. The second voltage is smaller than the first voltage in an erasing operation.

Hereinafter, embodiments of a nonvolatile semiconductor memory device will be described with reference to the drawings.

[First Embodiment]
[Schematic Configuration]

Figure 1:
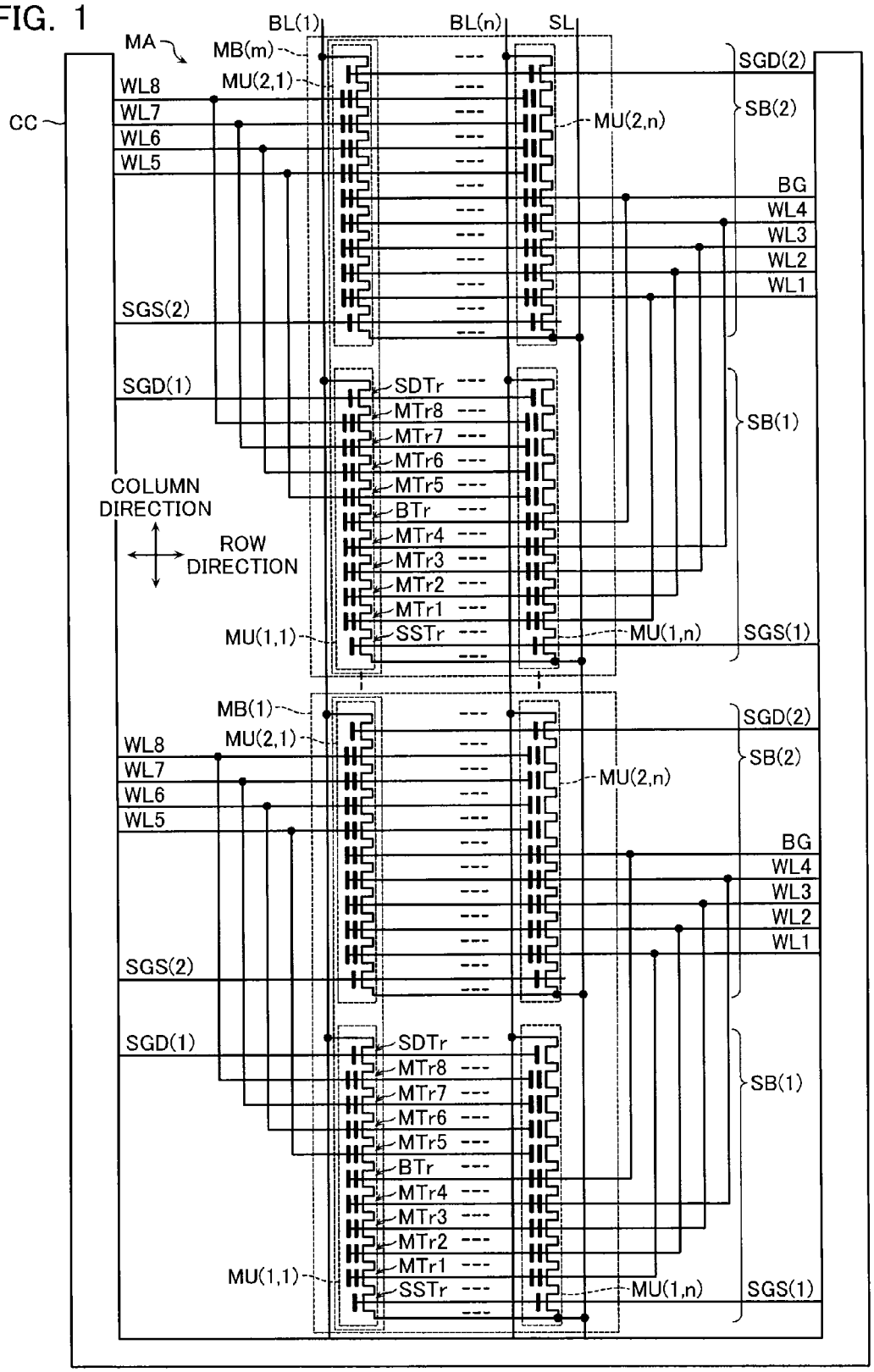
FIG. 1 illustrates a memory cell array MA and a control circuit CC of a nonvolatile semiconductor memory device according to a first embodiment.

First, a schematic configuration of a nonvolatile semiconductor memory device according to a first embodiment will be described with reference to FIG. 1. The nonvolatile semiconductor memory device according to the first embodiment includes a memory cell array MA and a peripheral circuit CC as shown in FIG. 1. A specific configuration of the peripheral circuit CC will be described later in FIG. 5.

The memory cell array MA includes m memory blocks MB(1) ... MB(m) as shown in FIG. 1. It is to be noted that, in the following description, all the memory blocks MB(1) . . . MB(m) may be collectively described as memory blocks MB.

Each memory block MB has two sub blocks SB(1) and SB(2). Having two sub blocks is illustrative only, and the number is not limited to this.

The sub block SB(1) has n memory units MU(1, 1) to MU(1, n). The sub block SB(2) has n memory units MU(2, 1) to MU(2, n). Having n memory units is illustrative only, and the number is not limited to this. It is to be noted that, in the following description, all the sub blocks SB(1) and SB(2) may be collectively described as sub blocks SB. Also, all the memory units MU(1, 1) to MU(2, n) may be collectively described as memory units MU. One end of the memory unit MU is connected to a bit line BL while the other end of the memory unit MU is connected to a source line SL. The bit line BL is formed to extend in a column direction so as to stride over the plurality of memory blocks MB. In the following description, all the bit lines BL(1) to BL(n) may be collectively described as bit lines BL.

The memory unit MU has a memory string MS, a source-side select transistor SSTr, and a drain-side select transistor SDTr.

The memory string MS has memory transistors MTr1 to MTr8 (memory cells) and a back gate transistor BTr connected in series as shown in FIG. 1. The memory transistors MTr1 to MTr4 and MTr5 to MTr8 are connected in series, respectively. The back gate transistor BTr is connected between the memory transistor MTr4 and the memory transistor MTr5.

Each of the memory transistors MTr1 to MTr8 holds data by accumulating charges in a charge accumulation layer thereof. The back gate transistor BTr is in a conductive state in a case where at least the memory string MS is selected as an operating target.

In each of the memory blocks MB(1) to MB(m), word lines WL1 to WL8 are connected in common to gates of the memory transistors MTr1 to MTr8 arranged in an n-row, 2-column matrix form, respectively. A back gate line BG is connected in common to gates of the n-row, 2-column back gate transistors BTr.

A drain of the source-side select transistor SSTr is connected to a source of the memory string MS. A source of the source-side select transistor SSTr is connected to the source line SL. In each of the sub blocks SB(1) and SB(2), each of source-side select gate lines SGS(1) and SGS(2) is connected in common to gates of the n source-side select transistors SSTr arranged in a line in a row direction. It is to be noted that, in the following description, the source-side select gate lines SGS(1) and (2) may be collectively referred to as source-side select gate lines SGS without distinguishing them.

A source of the drain-side select transistor SDTr is connected to a drain of the memory string MS. A drain of the drain-side select transistor SDTr is connected to the bit line BL. In each of the sub blocks SB(1) and SB(2), each of drain-side select gate lines SGD(1) and SGD(2) is connected in common to gates of the n drain-side select transistors SDTr arranged in a line in a row direction. It is to be noted that, in the following description, the drain-side select gate lines SGD(1) and (2) may be collectively referred to as drain-side select gate lines SGD without distinguishing them.

[Stacking Structure]

Figure 2:
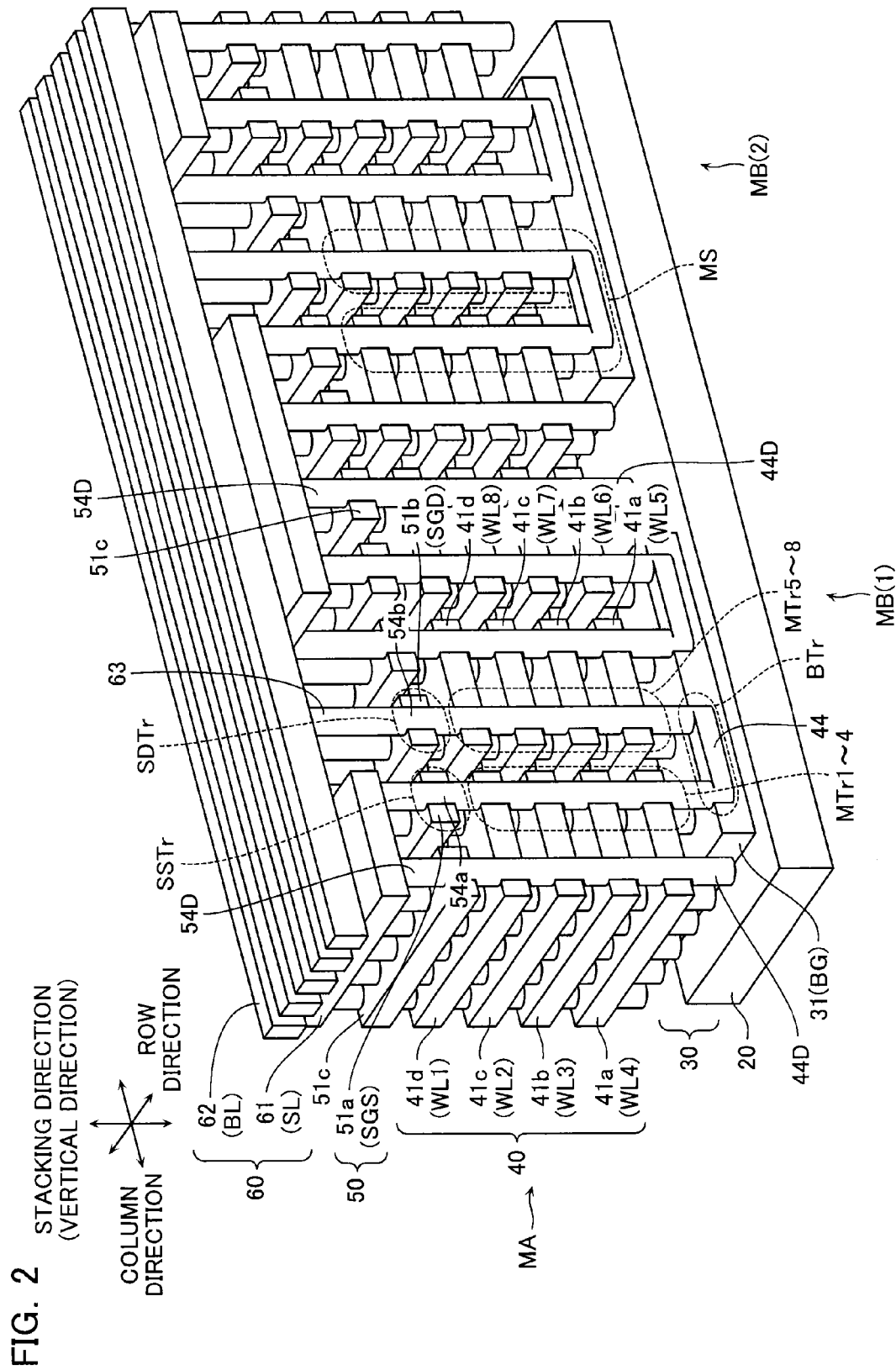
FIG. 2 is a perspective view illustrating a stacking structure of the memory cell array MA according to the first embodiment.
Figure 3:
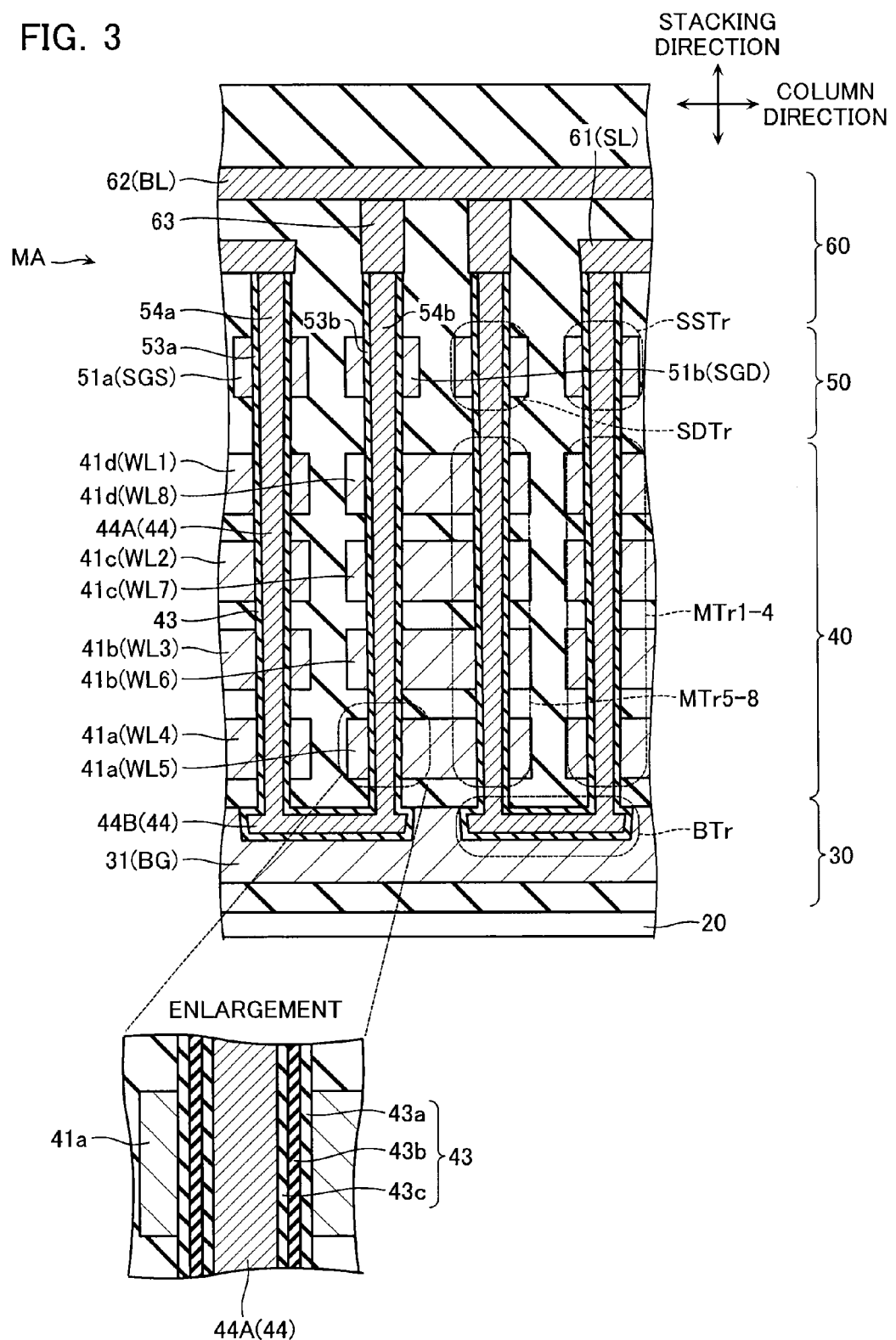
FIG. 3 is a cross-sectional view illustrating the stacking structure of the memory cell array MA according to the first embodiment.

Each memory block MB has a back gate layer 30, a memory layer 40, a select transistor layer 50, and a wiring layer 60 stacked sequentially on a semiconductor substrate as shown in FIGS. 2 and 3. The back gate layer 30 functions as the back gate transistor BTr. The memory layer 40 functions as the memory transistors MTr1 to MTr8. The select transistor layer 50 functions as the drain-side select transistor SDTr and the source-side select transistor SSTr. The wiring layer 60 functions as the source line SL and the bit line BL.

The back gate layer 30 has a back gate conductive layer 31 as shown in FIGS. 2 and 3. The back gate conductive layer 31 functions as the back gate line BG and a gate of the back gate transistor BTr. The back gate conductive layer 31 is formed to spread in a plate shape two-dimensionally in the row direction and the column direction parallel to the semiconductor substrate 20. The back gate conductive layer 31 is made of, e.g., a polysilicon (poly-Si) material.

The back gate layer 30 has a memory gate insulating layer 43 and a joining semiconductor layer 44B as shown in FIG. 3. The memory gate insulating layer 43 is provided between the joining semiconductor layer 44B and the back gate conductive layer 31. The joining semiconductor layer 44B functions as a body (channel) of the back gate transistor BTr. The joining semiconductor layer 44B is formed to dig in the back gate conductive layer 31. The joining semiconductor layer 44B is formed approximately in a rectangular shape whose longitudinal direction is a column direction as seen from the upper surface. The joining semiconductor layers 44B are formed in a matrix form in the row direction and the column direction in each memory block MB. The joining semiconductor layer 44B is made of, e.g., a polysilicon (poly-Si) material.

The memory layer 40 is formed in an upper layer of the back gate layer 30 as shown in FIGS. 2 and 3. The memory layer 40 has four-layered word line conductive layers 41a to 41d. The word line conductive layer 41a functions as the word line WL4 and a gate of the memory transistor MTr4. The word line conductive layer 41a also functions as the word line WL5 and a gate of the memory transistor MTr5. Similarly, the word line conductive layers 41b to 41d function as the word lines WL1 to WL3 and gates of the memory transistors MTr1 to MTr3, respectively. The word line conductive layers 41b to 41d also function as the word lines WL6 to WL8 and gates of the memory transistors MTr6 to MTr8, respectively.

The word line conductive layers 41a to 41d are stacked to sandwich an interlayer insulating layer 45 therebetween vertically. Each of the word line conductive layers 41a to 41d is formed to extend in the row direction (vertical direction of the drawing sheet of FIG. 3) as a longitudinal direction. The word line conductive layers 41a to 41d are made of, e.g., a polysilicon (poly-Si) material.

The memory layer 40 has the memory gate insulating layer 43, a columnar semiconductor layer 44A, and a dummy semiconductor layer 44D as shown in FIGS. 2 and 3. The memory gate insulating layer 43 is provided between the columnar semiconductor layer 44A and the word line conductive layers 41a to 41d. The columnar semiconductor layer 44A functions as bodies (channels) of the memory transistors MTr1 to MTr8. The dummy semiconductor layer 44D is provided in relation to the arrangement pitch and does not constitute a part of the memory transistors MTr1 to MTr8.

The memory gate insulating layer 43 has a block insulating layer 43a, a charge accumulation layer 43b, and a tunnel insulating layer 43c from a lateral side of the word line conductive layers 41a to 41d to a side of a memory semiconductor layer 44. The charge accumulation layer 43b is configured to enable accumulation of charges.

The block insulating layer 43a is formed to have a predetermined thickness on lateral walls of the word line conductive layers 41a to 41d. The charge accumulation layer 43b is formed to have a predetermined thickness on a lateral wall of the block insulating layer 43a. The tunnel insulating layer 43c is formed to have a predetermined thickness on a lateral wall of the charge accumulation layer 43b. The block insulating layer 43a and the tunnel insulating layer 43c are made of a silicon oxide (SiO₂) material. The charge accumulation layer 43b is made of a silicon nitride (SiN) material.

The columnar semiconductor layer 44A is formed to penetrate the word line conductive layers 41a to 41d and the interlayer insulating layer 45. The columnar semiconductor layer 44A extends in a vertical direction to the semiconductor substrate 20. The columnar semiconductor layers 44A forming a pair are formed to match vicinities of end portions of the joining semiconductor layer 44B in the column direction. The columnar semiconductor layer 44A is made of, e.g., a polysilicon (poly-Si) material. Meanwhile, the dummy semiconductor layer 44D is formed to penetrate the word line conductive layers 41a to 41d and the interlayer insulating layer 45. Since the dummy semiconductor layer 44D does not constitute a part of the memory transistors MTr1 to MTr8 as described above, the dummy semiconductor layer 44D is not provided with the joining semiconductor layer 44B and the back gate conductive layer 31 on a lower side thereof.

In the aforementioned back gate layer 30 and memory layer 40, a pair of the columnar semiconductor layers 44A and the joining semiconductor layer 44B joining their lower ends constitute the memory semiconductor layer 44 functioning as a body (channel) of the memory string MS. The memory semiconductor layer 44 is formed in a U shape as seen from the row direction.

To briefly describe a configuration of the aforementioned back gate layer 30, the back gate conductive layer 31 is formed to surround a side surface and a lower surface of the joining semiconductor layer 44B via the memory gate insulating layer 43. Also, to briefly describe a configuration of the aforementioned memory layer 40, the word line conductive layers 41a to 41d are formed to surround a side surface of the columnar semiconductor layer 44A via the memory gate insulating layer 43.

The select transistor layer 50 has a source-side conductive layer 51a, a drain-side conductive layer 51b, and a dummy conductive layer 51c as shown in FIGS. 2 and 3. The source-side conductive layer 51a functions as the source-side select gate line SGS and a gate of the source-side select transistor SSTr. The drain-side conductive layer 51b functions as the drain-side select gate line SGD and a gate of the drain-side select transistor SDTr. The dummy conductive layer 51c is provided in relation to the arrangement pitch and does not function as the source-side select gate line SGS and the drain-side select gate line SGD.

The source-side conductive layer 51a is formed in an upper layer of one columnar semiconductor layer 44A constituting the memory semiconductor layer 44. The drain-side conductive layer 51b is on the same layer as the source-side conductive layer 51a and is formed in an upper layer of the other columnar semiconductor layer 44A constituting the memory semiconductor layer 44. The dummy conductive layer 51c is on the same layer as the source-side conductive layer 51a and is provided at a part other than the upper layers of the columnar semiconductor layers 44A. A plurality of source-side conductive layers 51a, drain-side conductive layers 51b, and dummy conductive layers 51c are formed to extend in the row direction. The source-side conductive layers 51a and the drain-side conductive layers 51b are made of, e.g., a polysilicon (poly-Si) material.

The select transistor layer 50 has a source-side gate insulating layer 53a, a source-side columnar semiconductor layer 54a, a drain-side gate insulating layer 53b, a drain-side columnar semiconductor layer 54b, and a dummy semiconductor layer 54D as shown in FIG. 3. The source-side columnar semiconductor layer 54a functions as a body (channel) of the source-side select transistor SSTr. The drain-side columnar semiconductor layer 54b functions as a body (channel) of the drain-side select transistor SDTr.

The source-side gate insulating layer 53a is provided between the source-side conductive layer 51a and the source-side columnar semiconductor layer 54a. The source-side columnar semiconductor layer 54a is formed to penetrate the source-side conductive layer 51a. The source-side columnar semiconductor layer 54a is connected to a side surface of the source-side gate insulating layer 53a and an upper surface of one of the columnar semiconductor layers 44A forming a pair and is formed in a columnar shape so as to extend in the vertical direction to the semiconductor substrate 20. The source-side columnar semiconductor layer 54a is made of, e.g., a polysilicon (poly-Si) material.

The drain-side gate insulating layer 53b is provided between the drain-side conductive layer 51b and the drain-side columnar semiconductor layer 54b. The drain-side columnar semiconductor layer 54b is formed to penetrate the drain-side conductive layer 51b. The drain-side columnar semiconductor layer 54b is connected to a side surface of the drain-side gate insulating layer 53b and an upper surface of the other of the columnar semiconductor layers 44A forming a pair and is formed in a columnar shape so as to extend in the vertical direction to the semiconductor substrate 20. The drain-side columnar semiconductor layer 54b is made of, e.g., a polysilicon (poly-Si) material.

The dummy semiconductor layer 54D is formed to penetrate the dummy conductive layer 51c. The dummy semiconductor layer 54D is formed in an I shape. A lower surface of the dummy semiconductor layer 54D contacts an upper surface of the dummy semiconductor layer 44D.

The wiring layer 60 has a source line layer 61, a bit line layer 62, and a plug layer 63. The source line layer 61 functions as the source line SL. The bit line layer 62 functions as the bit line BL.

The source line layer 61 contacts an upper surface of the source-side columnar semiconductor layer 54a and is formed to extend in the row direction. The bit line layer contacts an upper surface of the drain-side columnar semiconductor layer 54b via the plug layer 63 and is formed to extend in the column direction. The source line layer 61, the bit line layer 62, and the plug layer 63 are made of, e.g., a metal material such as tungsten.

Next, with reference to FIG. 4, the shape of the word line conductive layer 41a will be described in detail. It is to be noted that description of the word line conductive layers 41b to 41d is not repeated here since they have similar shapes to that of the word line conductive layer 41a.

Figure 4:
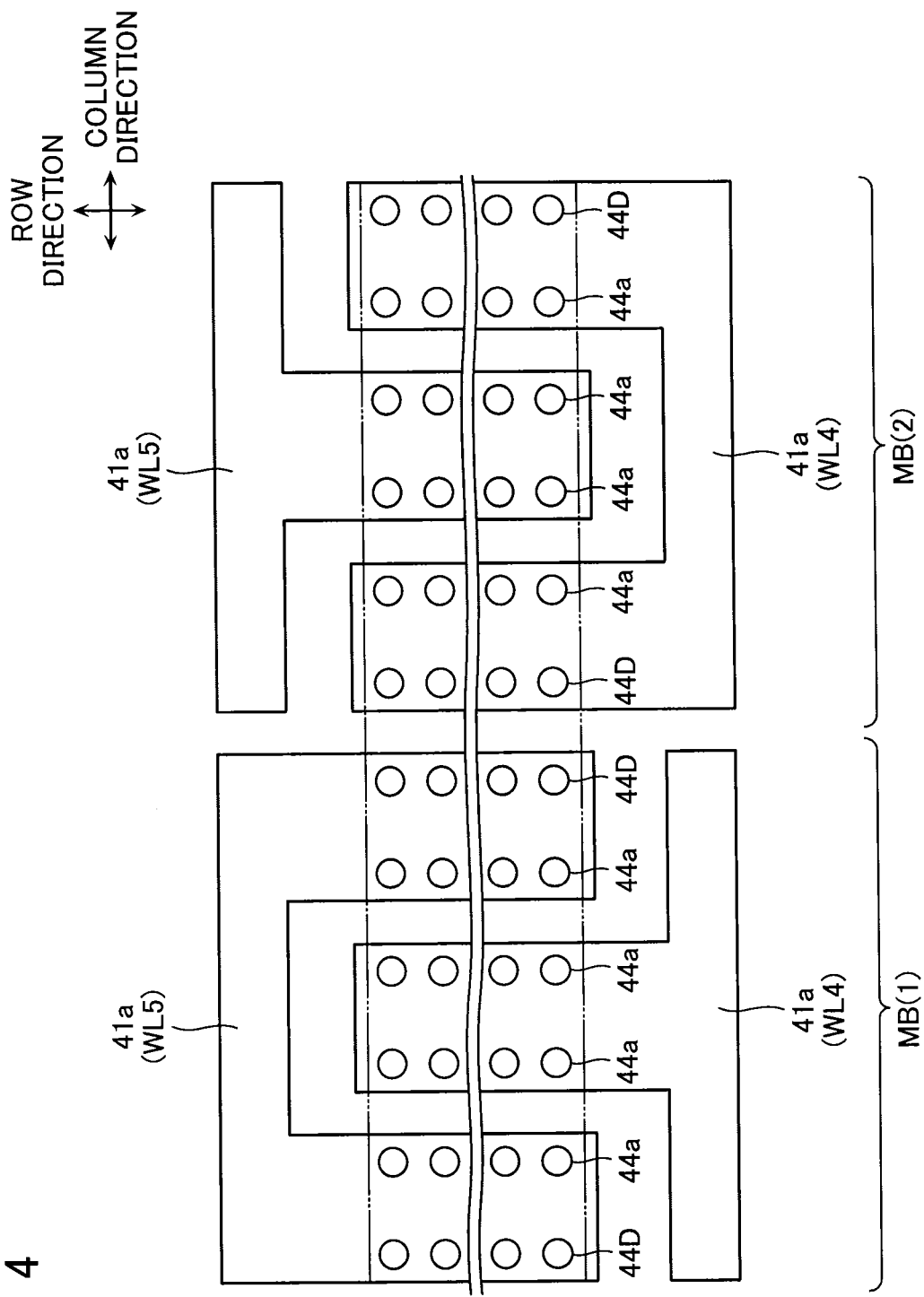

A pair of word line conductive layers 41a is provided in each memory block MB as shown in FIG. 4. One word line conductive layer 41a is formed in a T shape (protruded shape) as seen from the upper surface. The other word line conductive layer 41a is formed in a U shape (recessed shape) so as to be opposed to the T-shaped word line conductive layer 41a.

[Configuration of Peripheral Circuit CC]

Figure 5:
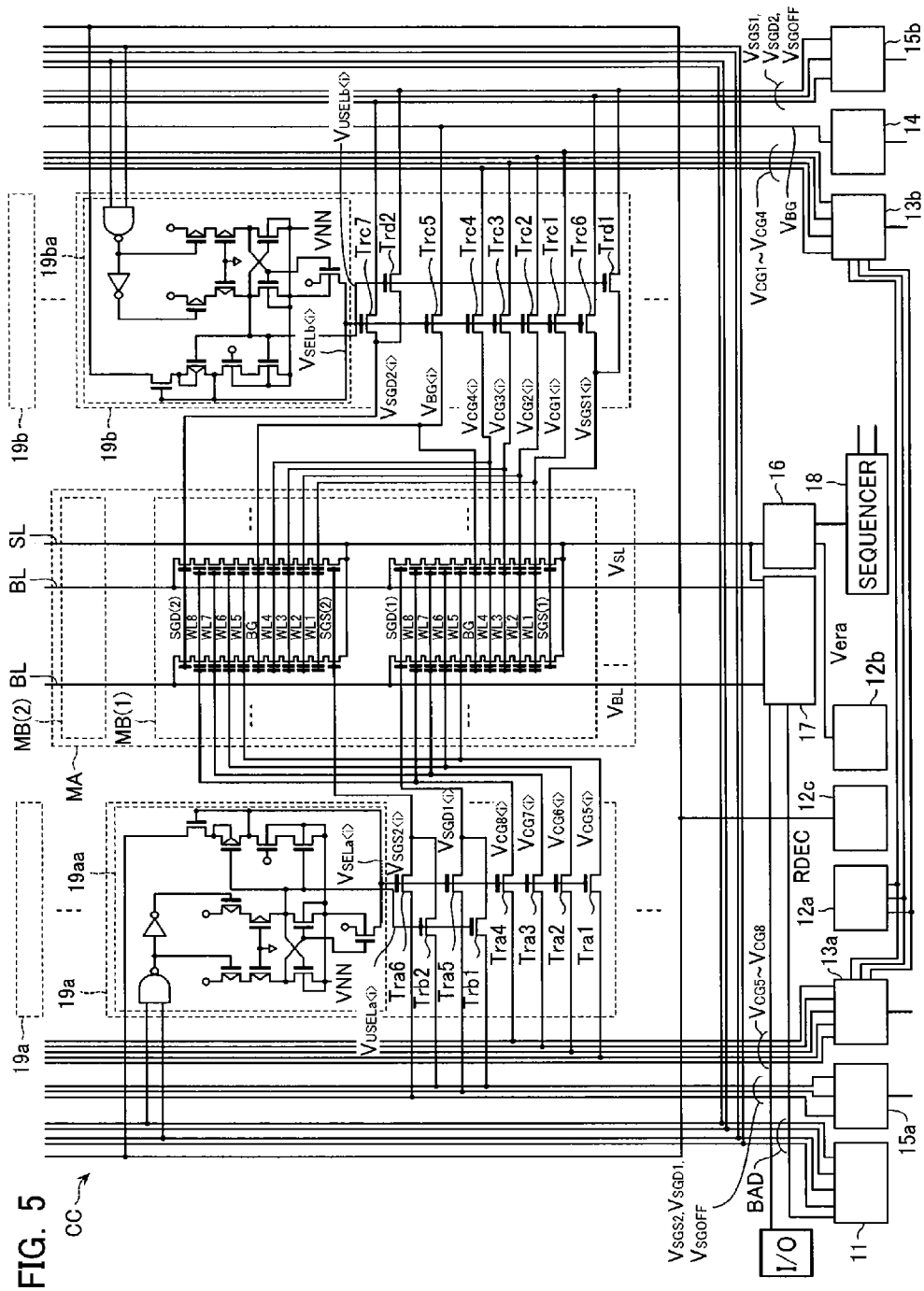
FIG. 5 is a circuit diagram illustrating the control circuit CC according to the first embodiment.

Next, referring to FIG. 5, a specific configuration of the peripheral circuit CC, which enables an erasing operation of the aforementioned first embodiment to be executed, will be described. The peripheral circuit CC has an address decoder circuit 11, booster circuits 12a to 12c, word line driving circuits 13a and 13b, a back gate line driving circuit 14, select gate line driving circuits 15a and 15b, a source line driving circuit 16, a sense amplifier circuit 17, a sequencer 18, and row decoder circuits 19a and 19b as shown in FIG. 5.

The address decoder circuit 11 is connected to the row decoders 19a and 19b via buses. The address decoder circuit 11 outputs a signal BAD to the row decoder circuits 19a and 19b. The signal BAD is a signal to designate a memory block MB(block address).

Each of the booster circuits 12a to 12c generates a booster voltage by raising a base voltage. The booster circuit 12a is connected to the word line driving circuits 13a and 13b. The booster circuit 12a transfers a booster voltage to the word line driving circuits 13a and 13b. The booster circuit 12b is connected to the source line driving circuit 16. The booster circuit 12b outputs a booster voltage to the source line driving circuit 16. The booster circuit 12c is connected to the row decoder circuits 19a and 19b. The booster circuit 12c outputs a booster signal RDEC to the row decoder circuits 19a and 19b.

The word line driving circuit 13a is connected to the row decoder 19a. The word line driving circuit 13a outputs signals VCG5 to VCG8 to the row decoder 19a. The word line driving circuit 13b is connected to the row decoder 19b. The word line driving circuit 13b outputs signals VCG1 to VCG4 to the row decoder 19b. The signals VCG1 to VCG8 are used when the word lines WL1 to WL8 in a selected memory block MB are driven.

The back gate line driving circuit 14 is connected to the row decoder 19b. The back gate line driving circuit 14 outputs a signal VBG to the row decoder 19b. The signal VBG is used when the back gate line BG in the selected memory block MB is driven.

The select gate line driving circuit 15a is connected to the row decoder 19a. The select gate line driving circuit 15a outputs a signal VSGS2, a signal VSGD1, and a signal VSGOFF to the row decoder 19a. The select gate line driving circuit 15b is connected to the row decoder 19b. The select gate line driving circuit 15b outputs a signal VSGS1, a signal VSGD2, and a signal VSGOFF to the row decoder 19b. The signals VSGS1 and VSGS2 are used when the source-side select gate lines SGS(1) and SGS(2) in the select memory block MB are driven, respectively. The signals VSGD1 and VSGD2 are used when the drain-side select gate lines SGD(1) and SGD(2) in the select memory block MB are driven, respectively. The signals VSGOFF are used when the source-side select gate lines SGS(1) and SGS(2) and the drain-side select gate lines SGD(1) and SGD(2) in a non-select memory block MB are driven.

The aforementioned signals VSGS2, VSGD1, and VSGOFF are input from the select gate line driving circuit 15a via the row decoder circuit 19a to various wires. Also, the signals VSGOFF, VSGD2, and VSGS1 are input from the select gate line driving circuit 15b via the row decoder circuit 19b to various wires.

The source line driving circuit 16 is connected to the source line SL. The source line driving circuit 16 outputs a signal VSL to the source line SL. The signal VSL is used when the source line SL is driven.

The sense amplifier circuit 17 is connected to the bit line BL. The sense amplifier circuit 17 outputs a signal VBL to charge the bit line BL to reach a predetermined voltage and thereafter determines holding data of the memory transistors MTr1 to MTr8 based on changes in the voltage of the bit line BL.

The sequencer 18 is connected to the aforementioned circuits 11 to 17. The sequencer 18 supplies the circuits 11 to 17 with control signals to control these circuits.

Each of the row decoder circuits 19a and 19b is provided for each memory block MB. The row decoder 19a is connected to the word lines WL5 to WL8, the source-side select gate line SGS(2), and the drain-side select gate line SGD(1). The row decoder 19b is connected to the word lines WL1 to WL4, the back gate line BG, the drain-side select gate line SGD(2), and the source-side select gate line SGS(1).

The row decoder circuit 19a inputs signals VCG5 <i> to VCG8 <i> to the gates of the memory transistors MTr5 to MTr8 via the word lines WL5 to WL8 based on the signal BAD and the signals VCG5 to VCG8. The row decoder circuit 19a also selectively inputs a signal VSGS2 <i> to the gate of the source-side select transistor SSTr in the sub block SB(2) via the source-side select gate line SGS(2) based on the signal BAD, the signal VSGS2, and the signal VSGOFF. The row decoder circuit 19a further selectively inputs a signal VSGD1 <i> to the gate of the drain-side select transistor SDTr in the sub block SB(1) via the drain-side select gate line SGD(1) based on the signal BAD, the signal VSGD1, and the signal VSGOFF.

The row decoder circuit 19a has a voltage converting circuit 19aa, first transfer transistors Tra1 to Tra6, and second transfer transistors Trb1 and Trb2. The voltage converting circuit 19aa is connected to the address decoder circuit 11, the booster circuit 12c, gates of the first transfer transistors Tra1 to Tra6, and gates of the second transfer transistors Trb1 and Trb2. The voltage converting circuit 19aa generates a signal VSELa <i> based on the signal BAD and the signal RDEC and outputs it to the gates of the first transfer transistors Tra1 to Tra6. The voltage converting circuit 19aa also generates a signal VUSELa <i> based on the signal BAD and the signal RDEC and outputs it to the gates of the second transfer transistors Trb1 and Trb2.

The first transfer transistors Tra1 to Tra4 are connected between the word line driving circuit 13a and the word lines WL5 to WL8, respectively. The first transfer transistors Tra1 to Tra4 output the signals VCG5 <i> to VCG8 <i> to the word lines WL5 to WL8 based on the signals VCG5 to VCG8 and VSELa <i>, respectively. The first transfer transistor Tra5 is connected between the select gate line driving circuit 15a and the drain-side select gate line SGD(1). The first transfer transistor Tra5 outputs the signal VSGD1 <i> to the drain-side select gate line SGD(1) based on the signal VSGD1 and the signal VSELa <i>. The first transfer transistor Tra6 is connected between the select gate line driving circuit 15a and the source-side select gate line SGS(2). The first transfer transistor Tra6 outputs the signal VSGS2 <i> to the source-side select gate line SGS(2) based on the signal VSGS2 and the signal VSELa <i>.

The second transfer transistor Trb1 is connected between the select gate line driving circuit 15a and the drain-side select gate line SGD(1). The second transfer transistor Trb2 is connected between the select gate line driving circuit 15a and the source-side select gate line SGS(2).

The row decoder circuit 19b inputs signals VCG1 <i> to VCG4 <i> to the gates of the memory transistors MTr1 to MTr4 via the word lines WL1 to WL4 based on the signal BAD and the signals VCG1 to VCG4. The row decoder circuit 19b also inputs a signal VBG <i> to the gate of the back gate transistor BTr via the back gate line BG based on the signal BAD and the signal VBG. The row decoder circuit 19b further selectively inputs a signal VSGS1 <i> to the gate of the source-side select transistor SSTr in the sub block SB(1) via the source-side select gate line SGS(1) based on the signal BAD, the signal VSGS1, and the signal VSGOFF. The row decoder circuit 19b still further selectively inputs a signal VSGD2 <i> to the gate of the drain-side select transistor SDTr in the sub block SB(2) via the drain-side select gate line SGD(2) based on the signal BAD, the signal VSGD2, and the signal VSGOFF.

The row decoder circuit 19b has a voltage converting circuit 19ba, first transfer transistors Trc1 to Trc7, and second transfer transistors Trd1 and Trd2. The voltage converting circuit 19ba is connected to the address decoder circuit 11, the booster circuit 12c, gates of the first transfer transistors Trc1 to Trc7, and gates of the second transfer transistors Trd1 and Trd2. The voltage converting circuit 19ba generates a signal VSELb <i> based on the signal BAD and the signal RDEC and outputs it to the gates of the first transfer transistors Trc1 to Trc7. The voltage converting circuit 19ba also generates a signal VUSELb <i> based on the signal BAD and the signal RDEC and outputs it to the gates of the second transfer transistors Trd1 and Trd2.

The first transfer transistors Trc1 to Trc4 are connected between the word line driving circuit 13b and the word lines WL1 to WL4, respectively. The first transfer transistors Trc1 to Trc4 output the signals VCG1 <i> to VCG4 <i> to the word lines WL1 to WL4 based on the signals VCG1 to VCG4 and VSELb <i>, respectively. The first transfer transistor Trc5 is connected between the back gate line driving circuit 14 and the back gate line BG. The first transfer transistor Trc5 outputs the signal VBG <i> to the back gate line BG based on the signal VBG and the signal VSELb <i>. The first transfer transistor Trc6 is connected between the select gate line driving circuit 15b and the source-side select gate line SGS(1). The first transfer transistor Trc6 outputs the signal VSGS1 <i> to the source-side select gate line SGS(1) based on the signal VSGS1 and the signal VSELb <i>. The first transfer transistor Trc7 is connected between the select gate line driving circuit 15b and the drain-side select gate line SGD(2). The first transfer transistor Trc7 outputs the signal VSGD2 <i> to the drain-side select gate line SGD(2) based on the signal VSGD2 and the signal VSELb <i>.

The second transfer transistor Trd1 is connected between the select gate line driving circuit 15b and the source-side select gate line SGS(1). The second transfer transistor Trd2 is connected between the select gate line driving circuit 15b and the drain-side select gate line SGD(2). The configuration of the peripheral circuit CC described above and shown in FIG. 5 enables an erasing operation of the first embodiment to be executed.

Figure 6:
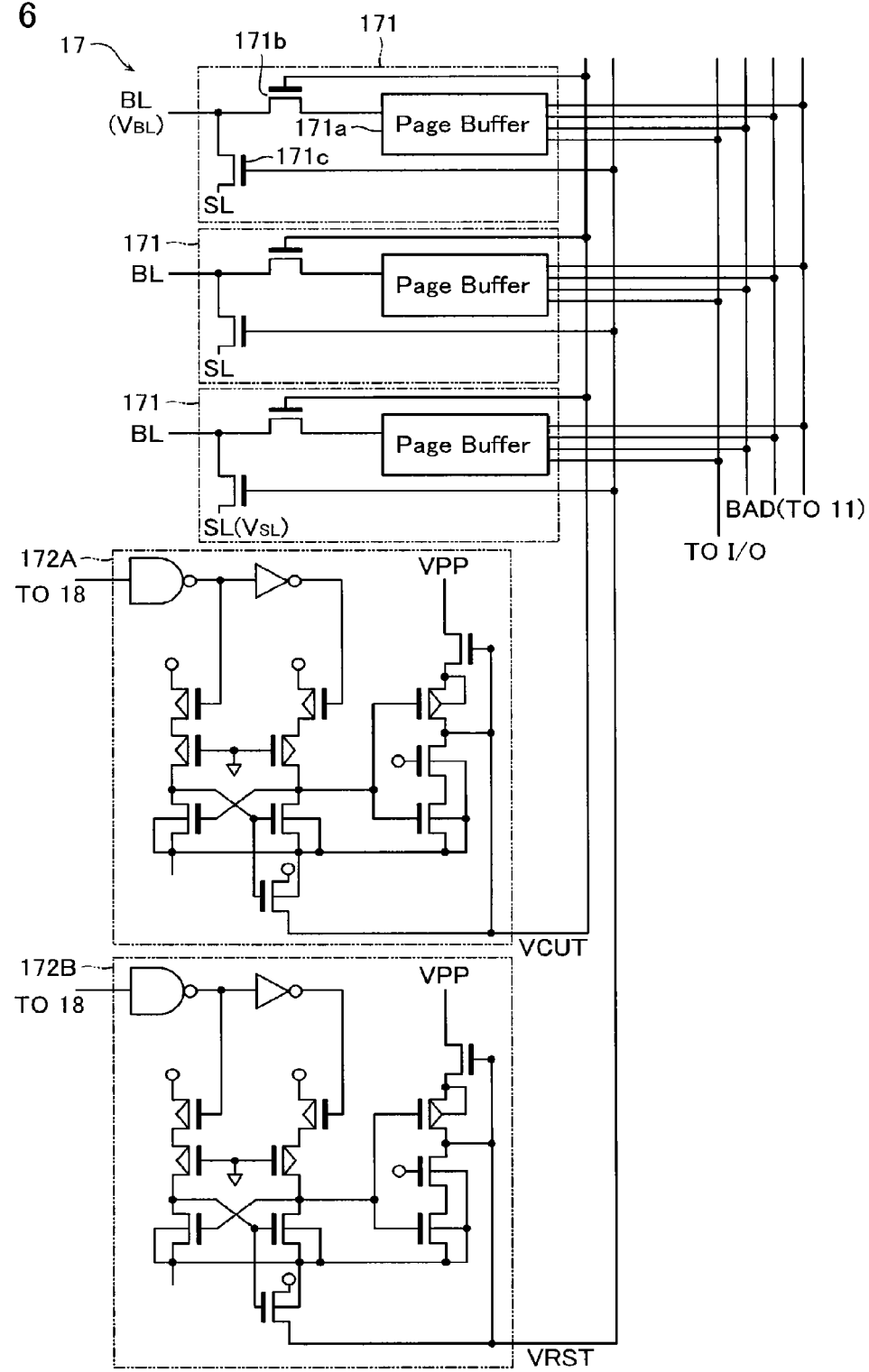
FIG. 6 is a circuit diagram illustrating a sense amplifier circuit 17.

Next, referring to FIG. 6, a specific configuration of the sense amplifier circuit 17 will be described. The sense amplifier circuit 17 has a plurality of select circuits 171 and voltage converting circuits 172A and 172B as shown in FIG. 6. The select circuit 171 selectively connects the bit line BL to the source line SL and sets a potential of the bit line BL to be equal to a potential of the source line SL.

The select circuit 171 has a page buffer 171a and transistors 171b and 171c as shown in FIG. 6. The page buffer 171a receives a signal from the bit line BL and inputs an output based on the signal to an input-output terminal I/O and the address decoder circuit 11 (refer to FIG. 5). One end of the transistor 171b is connected to the page buffer 171a. Also, the other end of the transistor 171b is connected to the bit line BL, and a control gate thereof receives an output signal VCUT from the voltage converting circuit 172A. One end of the transistor 171c is connected to the bit line BL. The other end of the transistor 171c is connected to the source line SL, and a control gate thereof receives an output signal VRST from the voltage converting circuit 172B.

The voltage converting circuit 172A receives a signal from the sequencer 18 and outputs the signal VCUT based on the signal. The voltage converting circuit 172B receives a signal from the sequencer 18 and outputs the signal VRST based on the signal.

[Erasing Operation]

Figure 7A:
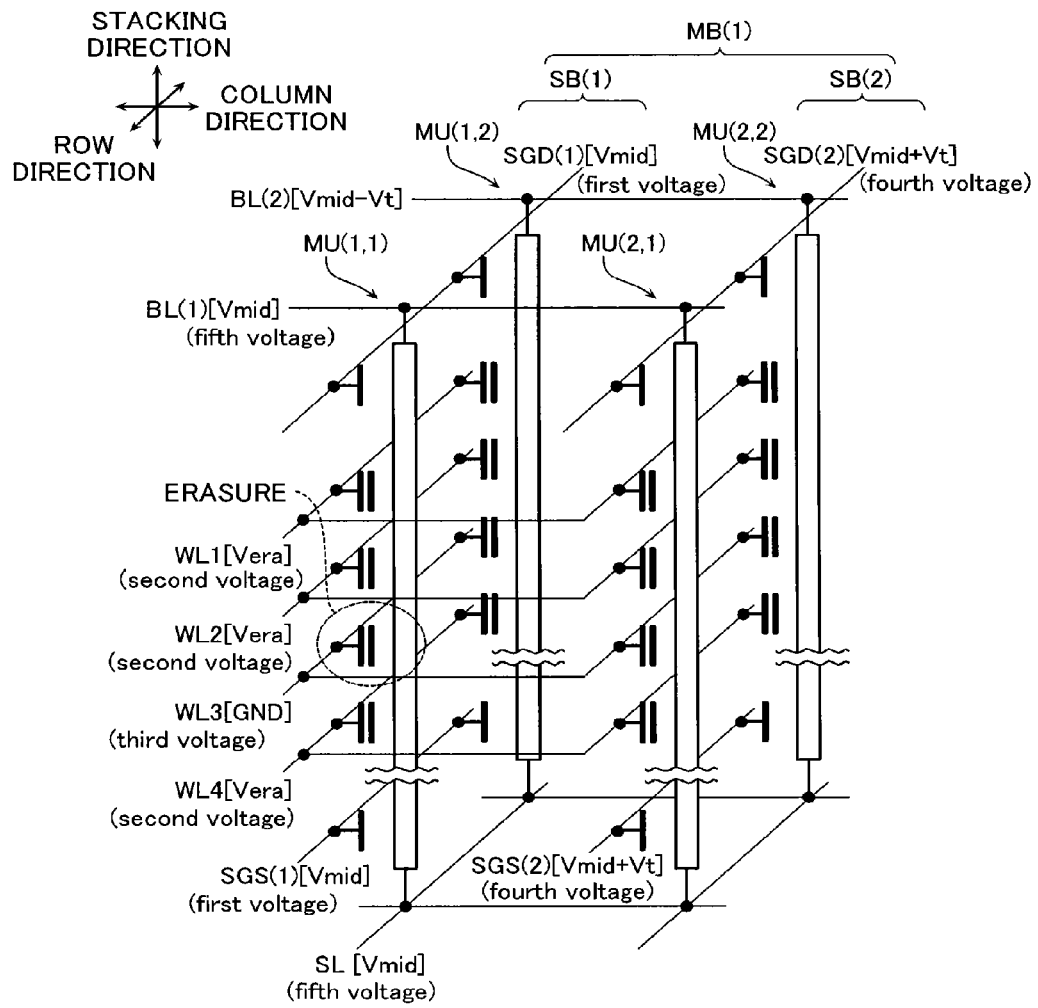
FIG. 7A illustrates voltages to be applied to various wires at the time of executing a selective erasing operation in a memory block according to the first embodiment.
Figure 7B:
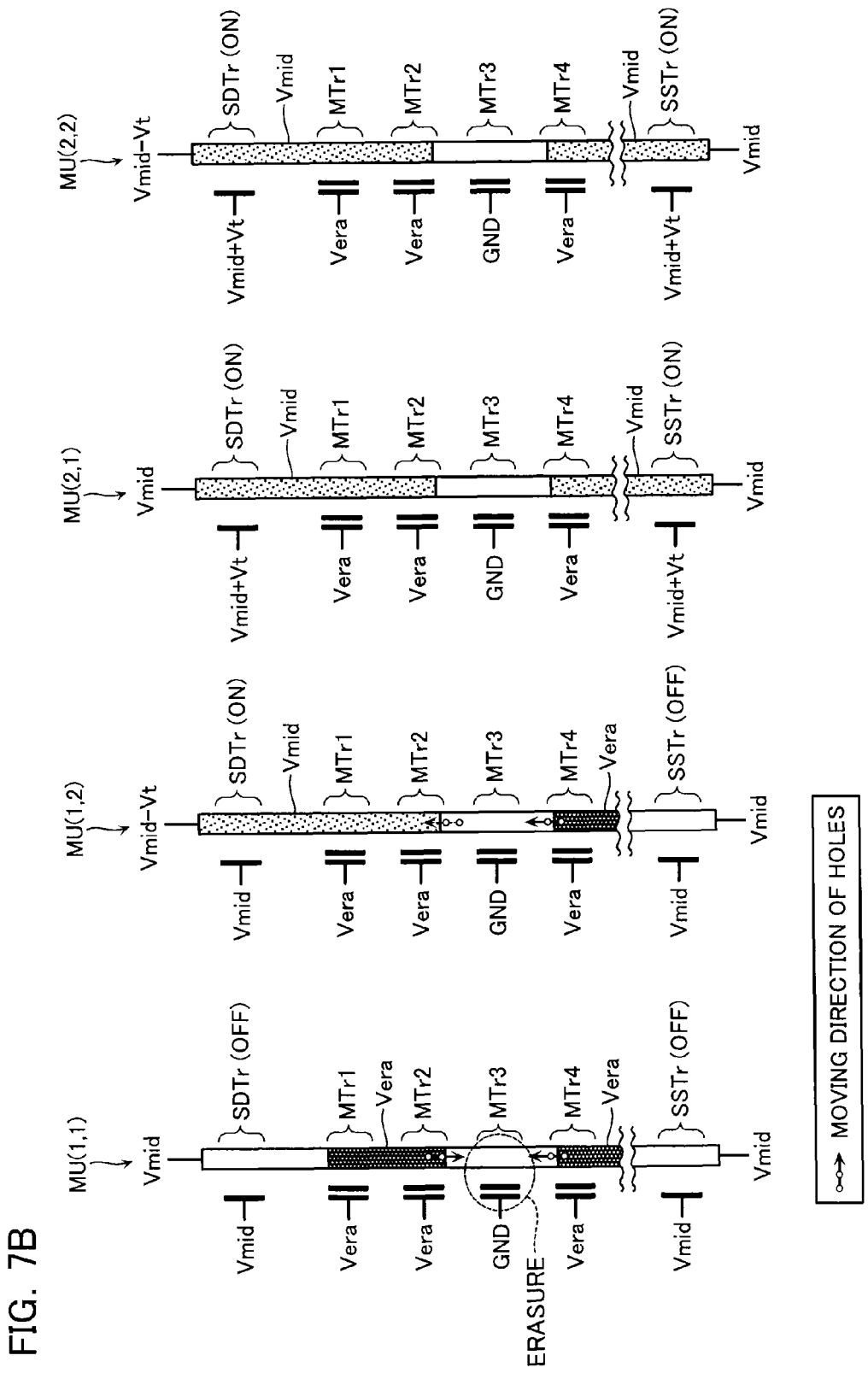
FIG. 7B illustrates states of respective memory units MU at the time of executing the selective erasing operation in one memory block.

Next, referring to FIGS. 7A and 7B, an erasing operation of the nonvolatile semiconductor memory device according to the first embodiment will be described. FIG. 7A illustrates voltages to be applied to various wires in a case of performing such a selective erasing operation. FIG. 7A schematically illustrates a memory unit MU(1, 1) containing a memory transistor targeted for erasure and memory units MU(1, 2), MU(2, 1), and MU(2, 2) in the same block. FIG. 7B illustrates individual states of the respective memory units MU at the time of executing the aforementioned selective erasing operation. It is to be noted that, in FIG. 7A, the memory transistors MTr5 to MTr8 are not shown, and bodies of the memory strings MS are shown to extend in a stacking direction.

As shown in FIG. 7A, the memory unit MU(1, 2) is connected in common to the memory unit MU(1, 1) by the source-side select gate line SGS(1) and the drain-side select gate line SGD(1). The memory unit MU(2, 2) is connected in common to the memory unit MU(2, 1) by the source-side select gate line SGS(2) and the drain-side select gate line SGD(2).

Also, as shown in FIG. 7A, the memory unit MU(2, 1) is connected in common to the memory unit MU(1, 1) by the bit line BL(1). Also, the memory unit MU(2, 2) is connected in common to the memory unit MU(1, 2) by the bit line BL(2).

In the FIG. 7A, the peripheral circuit CC executes an erasing operation selectively to a memory string MS (selected memory string) contained in the memory unit MU(1, 1) in the memory block MB(1) (selected memory block). More specifically, the peripheral circuit CC executes the erasing operation selectively, e.g., to the memory transistor MTr3 (selected memory transistor) of the memory string MS.

On the other hand, the peripheral circuit CC prohibits the erasing operation of the other memory transistors MTr1, MTr2, and MTr4 to MTr8 (non-selected memory transistors) in the selected memory unit MU(1, 1).

Also, the peripheral circuit CC prohibits the erasing operation of non-selected memory strings in the memory cell units MU(memory units MU(1, 2), MU(2, 1), and MU(2, 2)) other than the selected memory unit MU(1, 1) in the memory block MB(1).

As shown in FIG. 7A, at the time of the erasing operation, the bit line BL(1) connected to the memory unit MU(1, 1) is applied thereto a voltage Vmid (5 to 15 V or so). The source line SL is applied thereto a voltage Vmid. Here, a voltage Vt is a threshold voltage of the select transistors SSTr and SDTr or a voltage value approximate to it and is 1.5 V or so, for example.

To the word line WL3 (selected word line) connected to the gate of the selected memory transistor MTr3 is given a ground potential (GND). On the other hand, to the word lines WL1, WL2, WL4 to WL8 (non-selected word lines) and the back gate line BG are given ground potentials immediately after a start of the erasing operation and are thereafter given voltages Vera (Vera>Vmid) at after-mentioned timing.

Also, the drain-side select gate line SGD(1) and the source-side select gate line SGS(1) connected to the selected memory unit (1, 1) are applied thereto voltages Vmid.

Due to the above voltage control shown in FIG. 7A, in the memory unit MU(1, 1), the drain-side select transistor SDTr and the source-side select transistor SSTr are in non-conductive states, and the columnar semiconductor layer 44A (body) of the memory unit MU(1, 1) is in a floating state, as shown in FIG. 7B. Thereafter, the voltages Vera are applied to the non-selected word lines WL1, WL2, and WL4 connected to the gates of the non-selected memory transistors (MTr1 to 2, MTr4 to 8) in the memory unit (1, 1) while the ground voltage GND is applied to the selected word line WL3 connected to the gate of the selected memory transistor MTr3. By doing so, the potential of the body of each of the non-selected memory transistors MTr1 to 2 and MTr4 to 8 is raised close to the voltage Vera by capacitive coupling. On the other hand, the potential of the body of the selected memory transistor MTr3 is maintained close to the ground potential GND. The potential difference of the body of the memory transistor MTr3 and the potential differences of the bodies of the memory transistors MTr2 and MTr4 cause tunneling current in the memory transistor MTr3. Holes generated by this tunneling current are injected into the body of the memory transistor MTr3, and the voltage of the body of the memory transistor MTr3 is raised. By doing so, a high voltage is applied between the gate and the body of the memory transistor MTr3 (selected memory transistor), and the erasing operation is executed selectively to the memory transistor MTr3. Meanwhile, no holes are injected into any of the bodies of the memory transistors MTr1, MTr2, and MTr4 to MTr8, and the erasing operation is prohibited to the memory transistors MTr1, MTr2, and MTr4 to MTr8. In FIG. 7B, arrow and circle symbol shows a moving direction of holes.

Next, voltages to be applied to the non-selected memory unit MU(1, 2), to which the erasing operation is prohibited, will be described. As shown in FIG. 7A, the non-selected memory unit MU(1, 2) is connected to the word lines WL1 to WL8, the back gate line BG, the drain-side select gate line SGD(1), the source-side select gate line SGS(1), and the source line SL in common with the selected memory unit MU(1, 1). On the other hand, the non-selected memory unit MU(1, 2) is connected to the bit line BL(2), which is different from the bit line BL(1) connected to the selected memory unit MU(1, 1). To this bit line BL(2) is applied a voltage Vmid−Vt.

From the above voltage relations, in the non-selected memory unit MU(1, 2), since the voltages Vmid are applied to the source line SL and the source-side select gate line SGS(1) as shown in FIG. 7B, the source-side select transistor SSTr is maintained to be in a non-conductive state. On the other hand, the voltage Vmid−Vt is applied to the bit line BL(2) while the voltage Vmid is applied to the drain-side select gate line SGD(1), and thus, when the voltage of the body of the non-selected memory unit MU(1, 2) is raised to the voltage Vmid or higher, the drain-side select transistor SDTr is conductive. This prevents the potential of the body of the non-selected memory unit MU(1, 2) from being raised to the voltage Vmid or higher. That is, the potential of the body of the non-selected memory unit MU(1, 2) is raised by coupling because the potential of each of the non-selected word lines WL1, WL2, and WL4 is raised to Vera in a similar manner to the selected memory unit MU(1, 1). However, when the potential of the body is raised to the voltage Vmid or higher, the drain-side select transistor SDTr and the source-side select transistor SSTr turn on. Thus, the potential of the body of the non-selected memory unit MU(1, 2) is not raised to the voltage Vmid or higher. Accordingly, in the non-selected memory unit MU(1, 2), the voltage of the body of each of the memory transistors MTr1 to 2 and 4 to 8 is maintained close to the voltage Vmid. The potential difference between the voltage Vmid and the voltage Vera is set to a value that prevents a sufficient erasing operation from being executed. Thus, data held in the memory transistors MTr1 to 2 and 4 to 8 does not change. Also, the potential difference between the voltage Vmid and the ground voltage GND is set to a value that prevents a sufficient erasing operation from being executed in a similar manner to the potential difference between the voltage Vmid and the voltage Vera. Thus, data held in the memory transistor MTr3 does not change.

Next, voltages to be applied to the non-selected memory unit MU(2, 1), to which the erasing operation is similarly prohibited, will be described. As shown in FIG. 7A, the non-selected memory unit MU(2, 1) is connected to the word lines WL1 to WL8, the back gate line BG, the bit line BL(1), and the source line SL in common with the selected memory unit MU(1, 1). On the other hand, the non-selected memory unit MU(2, 1) is connected to the drain-side select gate line SGD(2) and the source-side select gate line SGS(2), which are different from the drain-side select gate line SGD(1) and the source-side select gate line SGS(1) connected to the selected memory unit MU(1, 1). To these drain-side select gate line SGD(2) and source-side select gate line SGS(2) are applied voltages Vmid+Vt.

From the above connection and voltages of the wires, in the non-selected memory unit MU(2, 1), since the voltage Vmid is applied to the source line SL, and the voltage Vmid+Vt is applied to the source-side select gate line SGS(2) as shown in FIG. 7B, the source-side select transistor SSTr is conductive. Also, since the voltage Vmid is applied to the bit line BL(1), and the voltage Vmid+Vt is applied to the drain-side select gate line SGD(2), the drain-side select transistor SDTr is conductive. Thus, the potential of the body of the non-selected memory unit MU(2, 1) is not raised to the voltage Vmid or higher. Accordingly, a sufficient erasing operation is not executed to the memory transistors MTr1 to 8, and data held in the memory transistors MTr1 to 8 does not change.

Next, voltages to be applied to the non-selected memory unit MU(2, 2), to which the erasing operation is similarly prohibited, will be described. As shown in FIG. 7A, the non-selected memory unit MU(2, 2) is connected to the word lines WL1 to WL8, the back gate line BG, and the source line SL in common with the selected memory unit MU(1, 1). The non-selected memory unit MU(2, 2) also is connected to the bit line BL(2) in common with the non-selected memory unit MU(1, 2). The non-selected memory unit MU(2, 2) further is connected to the drain-side select gate line SGD(2) and the source-side select gate line SGS(2) in common with the non-selected memory unit MU(2, 1).

From the above connection and voltages of the wires, in the non-selected memory unit MU(2, 2), the source-side select transistor SSTr and the drain-side select transistor SDTr are conductive as shown in FIG. 7B. Thus, the potential of the body of the non-selected memory unit MU(2, 2) is not raised to the voltage Vmid or higher. Accordingly, a sufficient erasing operation is not executed to the memory transistors MTr1 to 8, and data held in the memory transistors MTr1 to 8 does not change.

Next, the potential relations of the memory units MU(1, 1), MU(1, 2), MU(2, 1), and MU(2, 2) in the case of the voltage control as shown in FIG. 7A will be described further in detail with reference to FIGS. 8 to 11.

Figure 8:
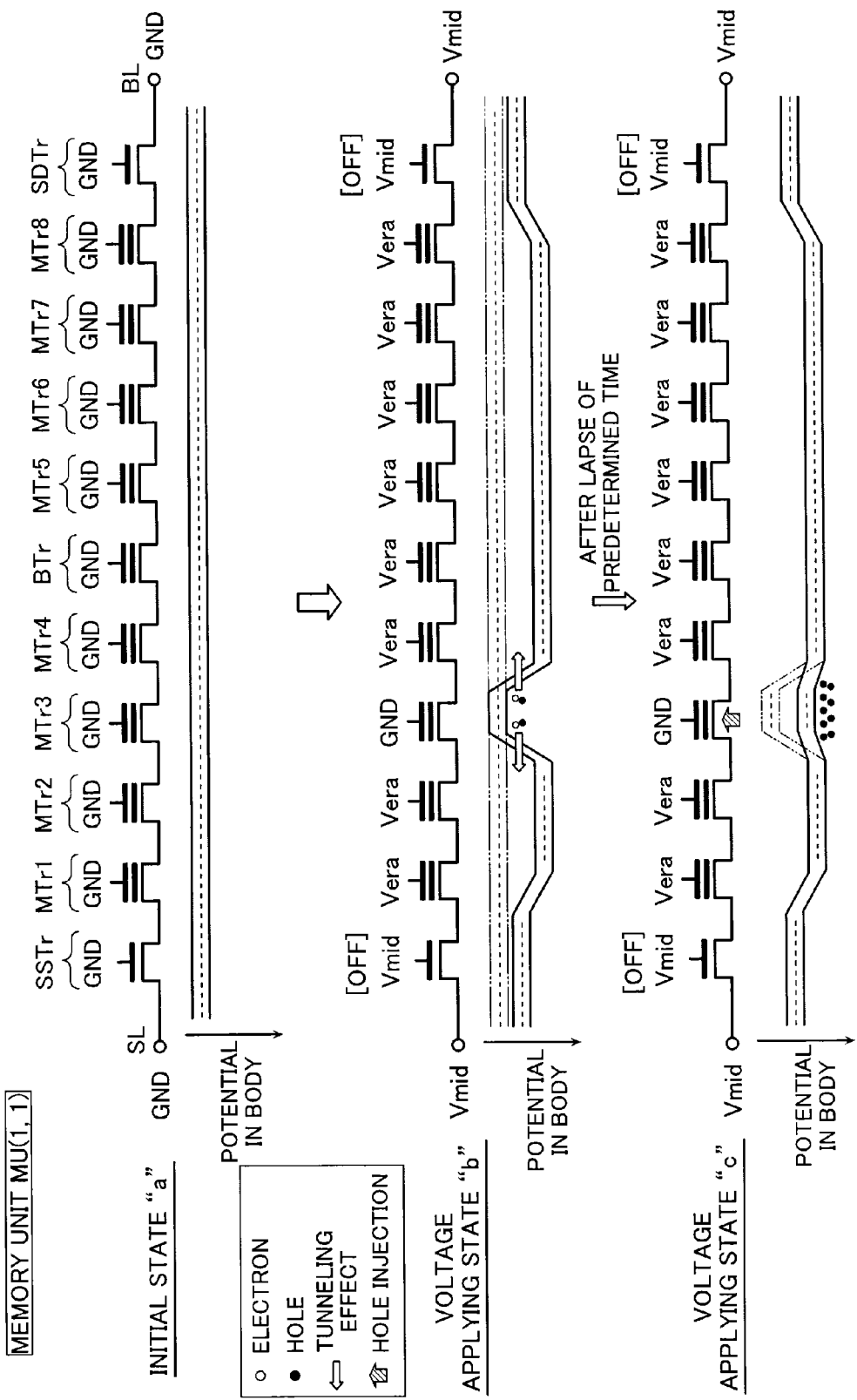
FIG. 8 illustrates potential relations in a memory unit MU(1, 1) in the erasing operation according to the first embodiment.

First, referring to FIG. 8, the potential relations of the selected memory unit MU(1, 1) will be described. As shown in FIG. 8, when a voltage is applied as in FIG. 7A described above in an initial state ("a" in FIG. 8), the drain-side select transistor SDTr and the source-side select transistor SSTr are in non-conductive states (OFF) ("b" in FIG. 8) in the selected memory unit MU(1, 1). By doing so, the bodies of the memory transistors MTr1 to MTr8 in the selected memory unit MU(1, 1) are in floating states.

In the state where the bodies of the memory transistors MTr1 to MTr8 are in floating states as described above, the voltages Vera are applied to the gates of the memory transistors MTr1, MTr2, and MTr4 to MTr8, and the voltage GND is applied to the gate of the memory transistor MTr3. Accordingly, while the voltages of the bodies of the memory transistors MTr1, MTr2, and MTr4 to MTr8 are raised to the voltages Vera as the bodies are coupled with their gates, the voltage of the body of the memory transistor MTr3 is not raised and is approximately the ground voltage GND. This causes potential constrictions between the memory transistor MTr3 and each of the memory transistors MTr2 and MTr4. At each of these potential constricted parts, tunneling current is generated beyond the potential barrier ("b" in FIG. 8).

Subsequently, after the lapse of predetermined time from the state "b" in FIG. 8, holes generated by the tunneling current are accumulated in the body of the memory transistor MTr3, and the voltage of the body of the memory transistor MTr3 is raised ("c" in FIG. 8). Consequently, by the potential difference between the raised voltage of the body of the memory transistor MTr3 and the ground voltage GND of the gate of the memory transistor MTr3, data in the memory transistor MTr3 is erased.

Next, referring to FIG. 9, the potential relations of the non-selected memory unit MU(1, 2) will be described. As shown in FIG. 9, when a voltage is applied as in FIG. 7A described above in an initial state ("a" in FIG. 9), and the voltages of the bodies of the memory transistors MTr4 to 8 are raised to the voltages Vmid or higher, the drain-side select transistor SDTr is in a conductive state (ON) while the source-side select transistor SSTr is maintained to be in a non-conductive state (OFF) ("b" in FIG. 9). By doing so, while electrons flow from the bit line BL via the drain-side select transistor SDTr, the memory transistors MTr1 and MTr2 are in floating states ("b" in FIG. 9). Thus, the bodies of the memory transistors MTr1 and MTr2 are coupled with their gates, to which the voltages Vera are applied, and are charged to reach the voltages Vera. On the other hand, the gate of the memory transistor MTr3 is grounded (GND). This causes a potential constriction between the memory transistor MTr2 and the memory transistor MTr3. At this potential constricted part, tunneling current is generated beyond the potential barrier ("b" in FIG. 9).

Figure 9:
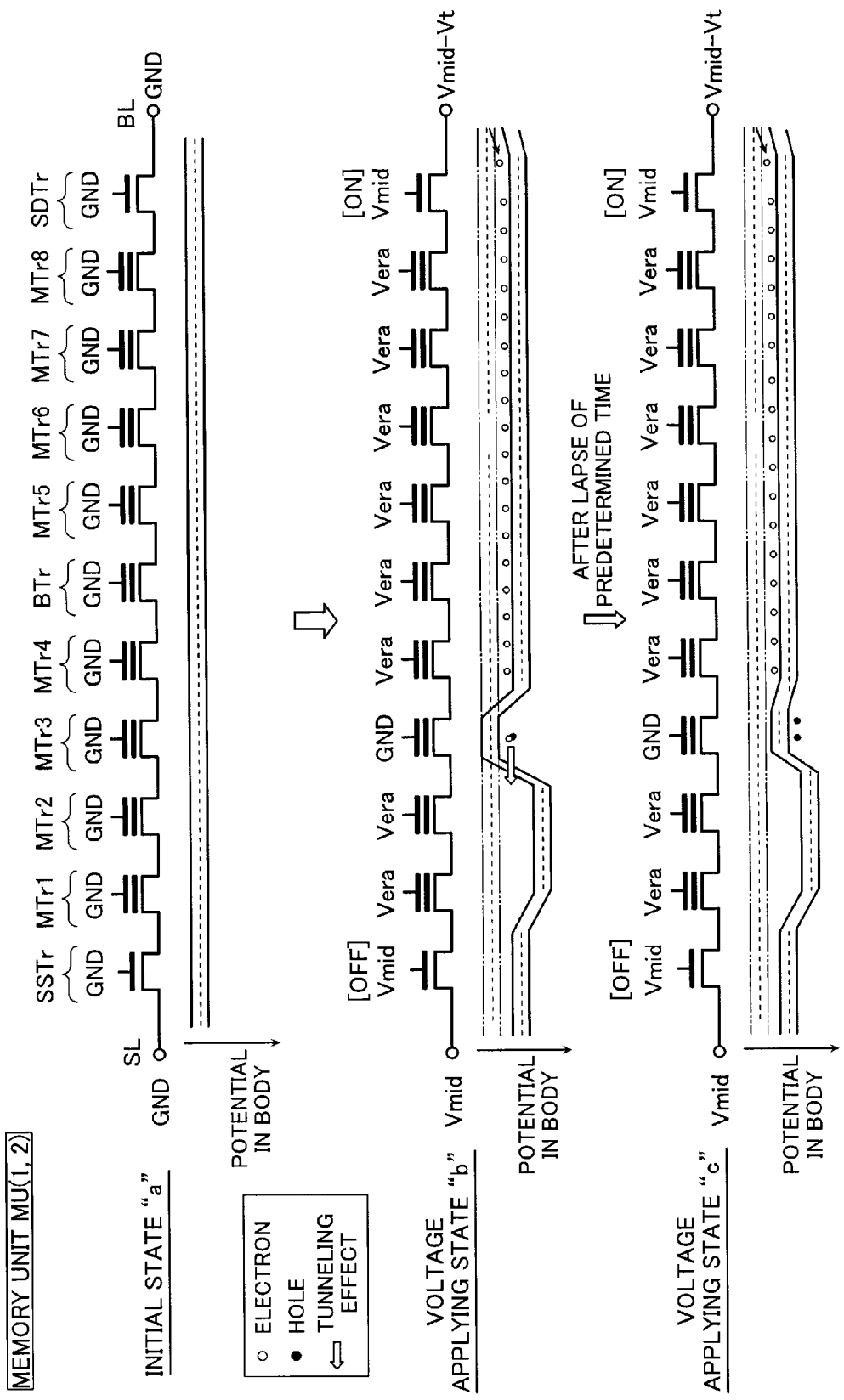
FIG. 9 illustrates potential relations in a memory unit MU(1, 2) in the erasing operation according to the first embodiment.

However, due to the potential relations, holes flow from the body of the memory transistor MTr3 to the body of the memory transistor MTr4, and the voltage of the body of the memory transistor MTr3 is not equal to or higher than the voltage Vmid ("c" in FIG. 9). Accordingly, in the non-selected memory unit MU(1, 2), no high voltage is applied between the gate and the body of the memory transistor MTr3, and data in the memory transistor MTr3 does not change. Meanwhile, a memory unit (1, 3) to an MU(1, n) have similar potential relations to those of the non-selected memory unit MU(1, 2), and data in the memory transistors MTr1 to MTr8 contained therein does not change.

Figure 10:
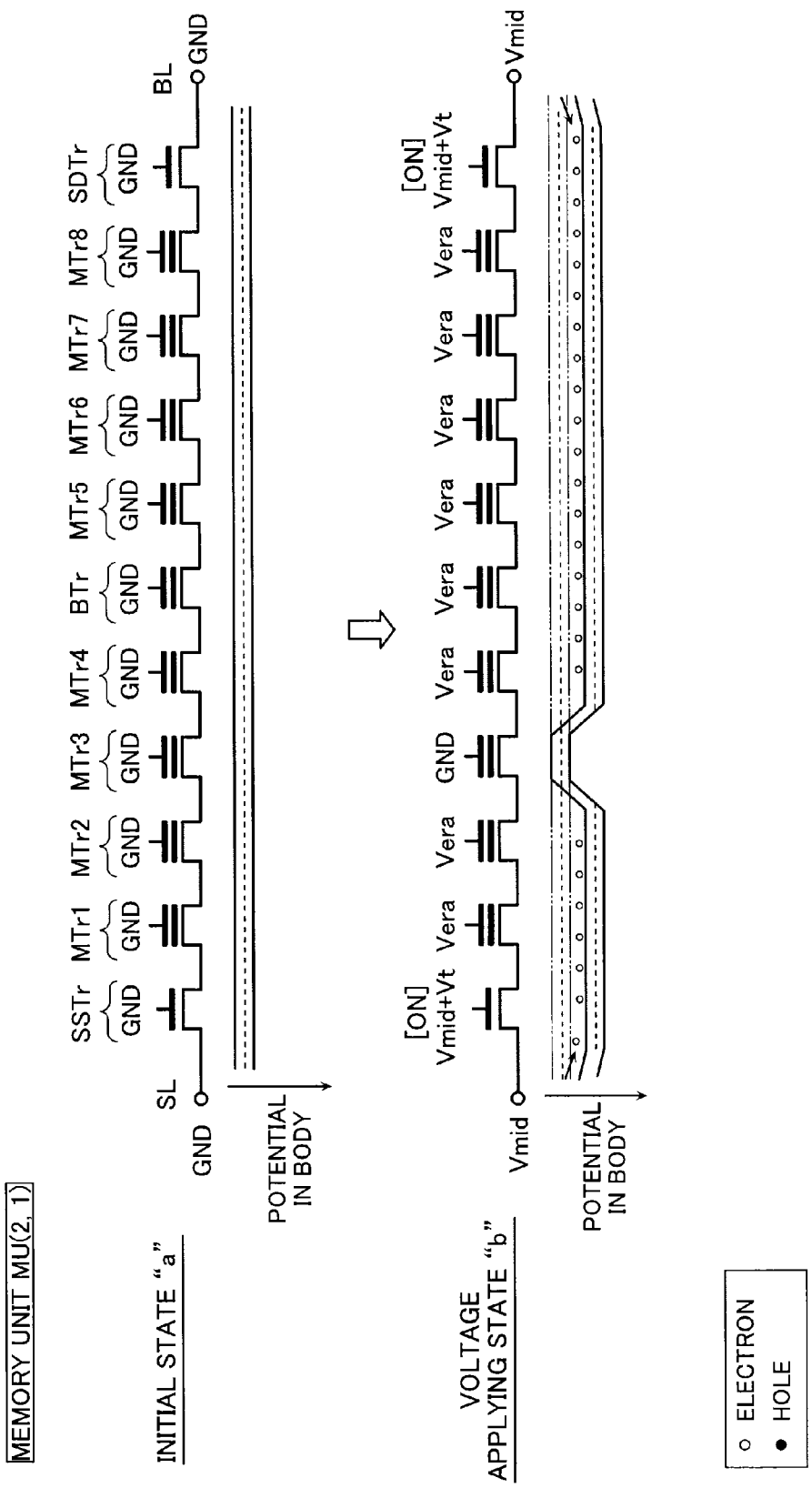
FIG. 10 illustrates potential relations in a memory unit MU(2, 1) in the erasing operation according to the first embodiment.

Next, referring to FIG. 10, the potential relations of the non-selected memory unit MU(2, 1) will be described. As shown in FIG. 10, when a voltage is applied as in FIG. 7A described above in an initial state ("a" in FIG. 10), the drain-side select transistor SDTr and the source-side select transistor SSTr are in conductive states (ON) ("b" in FIG. 10) in the non-selected memory unit MU(2, 1). By doing so, the bodies of the memory transistors MTr1, 2, and 4 to 8 are charged to reach the voltages Vmid. Thus, tunneling current is not generated, and the voltage of the body of the memory transistor MTr3 is only raised close to the voltage Vmid. Accordingly, in the non-selected memory unit MU(2, 1), no high voltage is applied between the gate and the body of the memory transistor MTr3, and data in the memory transistor MTr3 does not change.

Figure 11:
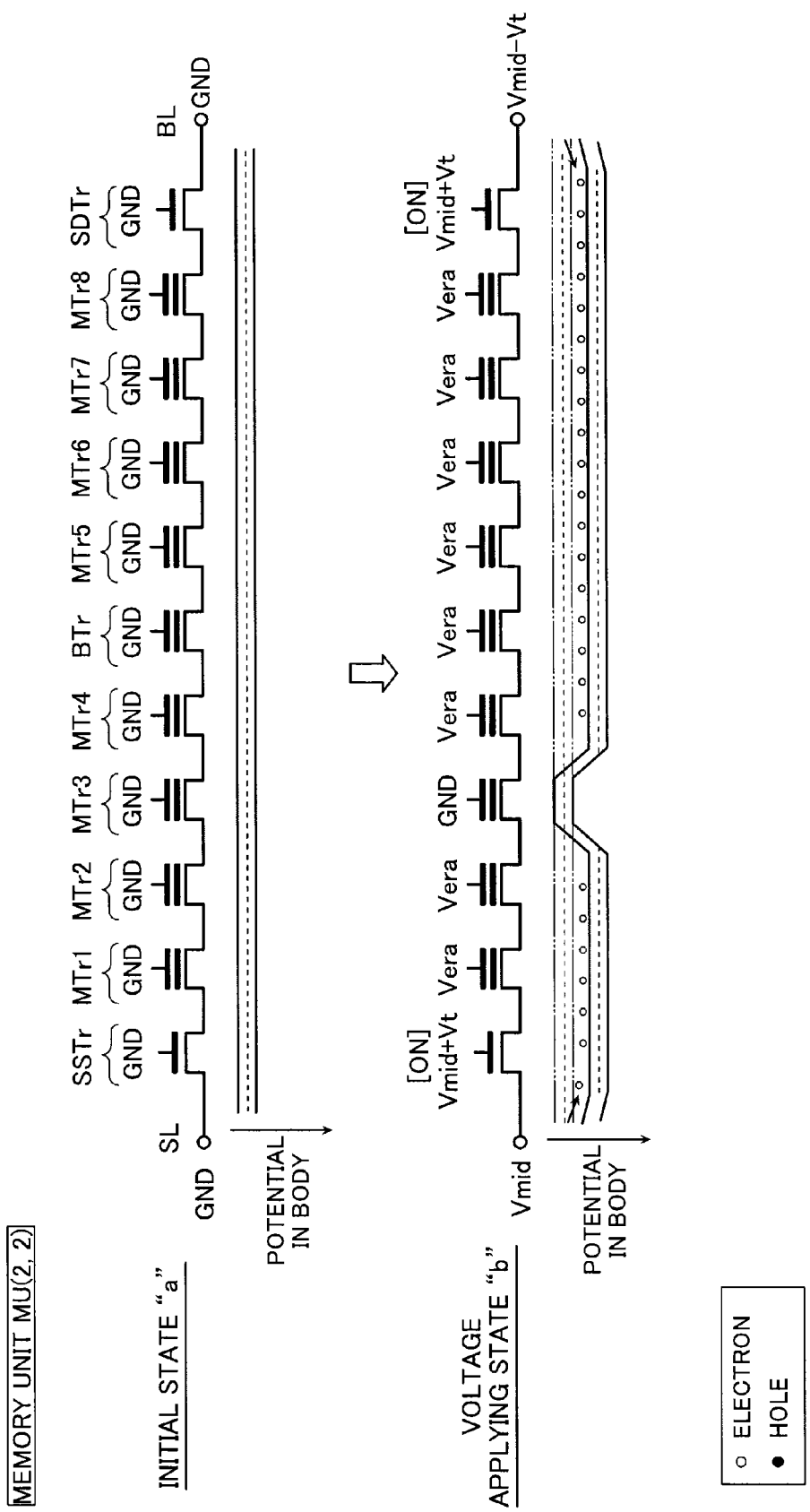
FIG. 11 illustrates potential relations in a memory unit MU(2, 2) in the erasing operation according to the first embodiment.

Next, referring to FIG. 11, the potential relations of the non-selected memory unit MU(2, 2) will be described. As shown in FIG. 11, when a voltage is applied as in FIG. 7A described above in an initial state ("a" in FIG. 11), the drain-side select transistor SDTr and the source-side select transistor SSTr are in conductive states (ON) ("b" in FIG. 11) in the memory unit MU(2, 2). By doing so, from similar reasons to those of the non-selected memory unit MU(2, 1), in the non-selected memory unit MU(2, 2), no high voltage is applied between the gate and the body of the memory transistor MTr3, and data in the memory transistor MTr3 does not change.

It is to be noted that the band diagrams shown in FIGS. 8 to 11 are illustrative only and may actually differ due to (Reason 1) to (Reason 3) described below.

(Reason 1: A case in which there exists a memory transistor in which charges are trapped in the charge accumulation layer)

In the above case, the charges trapped in the charge accumulation layer have an effect of shielding electric field exerted to the body by the gate. Thus, the potential in the body can be different from that in FIGS. 8 to 11 depending on the writing state in the memory transistor.

(Reason 2: A case in which behaviors of charges at a potential boundary differ)

In the description with reference to FIGS. 8 to 11, the tunneling effect occurs when the potential is above a potential difference and does not occur when the potential is below it for simplicity. Also, in the description, the charge flow occurs only in forward bias and stops in backward bias (until the tunneling effect occurs). However, since an intermediate state exists in an actual case, behaviors of charges are not always as simple as in FIGS. 8 to 11, and the potential in the body can be different from that in FIGS. 8 to 11.

(Reason 3: A case in which the carrier concentration in the body is not uniform)

In the description with reference to FIGS. 8 to 11, the impurity concentration in the body is constant for simplicity. However, in each of the body of the source-side select transistor SSTr, the body of the drain-side select transistor SDTr, and the body of the memory transistor MTr, the internal impurity concentration is adjusted at the time of manufacture. Thus, in a case where the carrier concentration in the body is not uniform due to conditions at the time of manufacture, the potential in the body can be different from that in FIGS. 8 to 11.

Next, referring to FIGS. 5 and 12, control timing of various wires at the time of the erasing operation will be described in detail. In the example shown in FIG. 12, an i-th memory block MB <i> is selected while the other memory block MB <x> is not selected. Also, a j-th bit line BL <j> is selected while a bit line BL <k> (k is a natural number other than j) is not selected.

Figure 12:
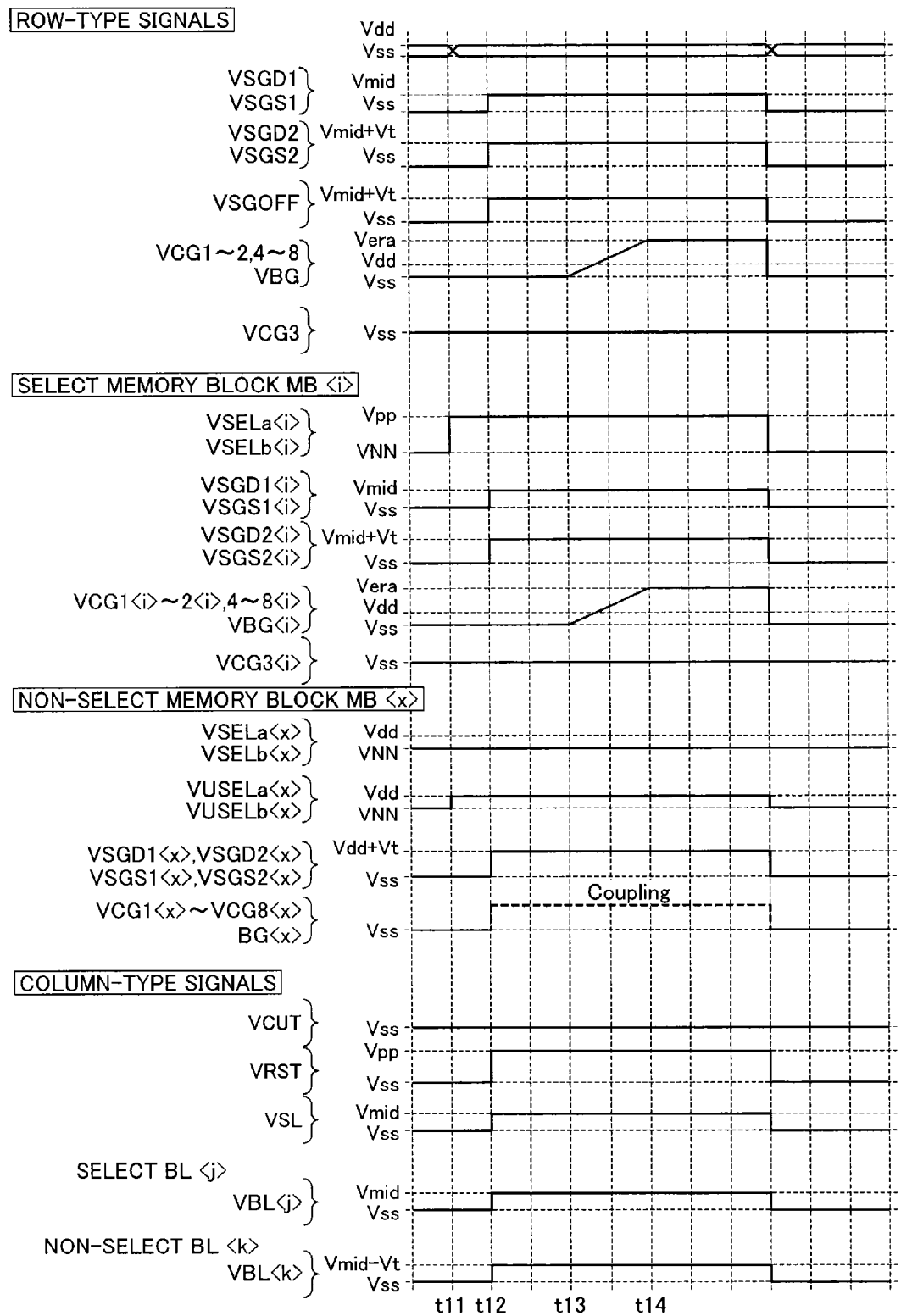
FIG. 12 is a first timing chart of the erasing operation according to the first embodiment.

As shown in FIG. 12, at time ti1, the voltages of the signal VSELa <i> and the signal VSELb <i> in the memory block MB <i> are first raised to voltages Vpp. The voltages of the other signal VSELa <x> and signal VSELb <x> are maintained to be voltages VNN. As a result, only the selected memory block MB <i> is selected while the other memory block MB <x> is not selected.

Subsequently, at time t12, the voltages of the signals VSGD1 <i> and VSGS1 <i> in the selected memory block MB <i> are raised to the voltages Vmid. By doing so, the voltages of the source-side select gate line SGS(1) and the drain-side select gate line SGD(1) are raised to the voltages Vmid. Also, at time t12, the voltages of the signals VSGD2 <i> and VSGS2 <i> are raised to the voltages Vmid+Vt. By doing so, the voltages of the source-side select gate line SGS(2) and the drain-side select gate line SGD(2) are raised to the voltages Vmid+Vt. Further, at time t12, the voltages of signals VBL <j> and VBL <k> are raised to the voltages Vmid and Vmid−Vt, respectively. By doing so, the voltages of the selected bit line BL <j> and the non-selected bit line BL <k> are raised to the voltages Vmid and Vmid−Vt, respectively.

Subsequently, from time t13 to t14, the voltages of the signals VCG1 <i> to 2 <i> and 4 <i> to 8 <i> are raised to the voltages Vera. By doing so, the voltages of the non-selected word lines WL1, WL2, and WL4 to WL8 and the back gate line BG in the selected memory block MB <i> are raised to the voltages Vera in a predetermined period of time from time t13 to t14. By the above timing control, only data held in one memory transistor MTr3 in the selected memory block MB <i> can be erased selectively.

In the above timing control shown in FIG. 12, in the selected memory unit MU(1, 1), after the drain-side select transistor SDTr and the source-side select transistor SSTr are in non-conductive states, the voltages of the word lines WL1, WL2, and WL4 to WL8 start to be raised. Accordingly, the potential of the body of the memory string MS can be raised reliably.

Figure 13:
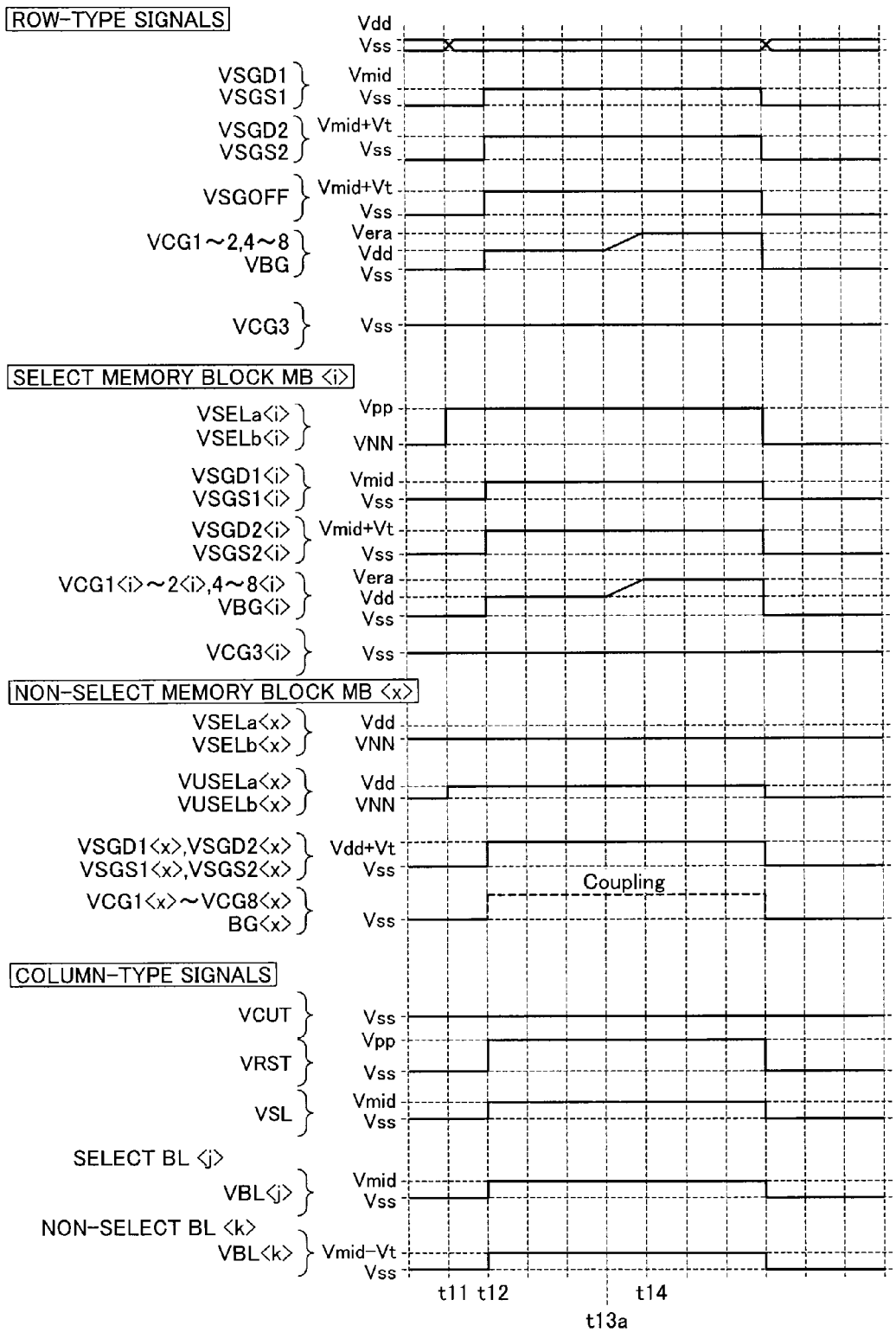
FIG. 13 is a second timing chart of the erasing operation according to the first embodiment.

The control timing of various wires at the time of the erasing operation of the present embodiment is not limited to the timing control shown in FIG. 12 and may be timing control shown in FIG. 13. In the timing control shown in FIG. 13, at time t12, after the voltages of the signals VCG1 <i> to 2 <i> and 4 <i> to 8 <i> are once raised to the voltages Vdd, they are maintained to be the voltages Vdd from time t12 to t13a. The voltages of the signals VCG1 <i> to 2 <i> and 4 <i> to 8 <i> are then raised to the voltages Vera in a predetermined period of time from time t13a to t14. By doing so, the voltages of the non-selected word lines WL1, WL2, and WL4 to WL8 and the back gate line BG in the selected memory block MB <i> are once raised to the voltages Vdd and are then maintained to be the voltages Vdd from time t12 to t13a. Subsequently, the voltages of the non-selected word lines WL1, WL2, and WL4 to WL8 and the back gate line BG are raised to the voltages Vera in a predetermined period of time from time t13a to t14. By such timing control as well, data held in one memory transistor MTr in the selected memory block MB <i> can be erased selectively.

In the above timing control shown in FIG. 13, in any of the selected memory unit MU(1, 1) and the non-selected memory units MU, the potential difference in each of the word lines WL1 to WL8, the source-side select gate line SGS, the drain-side select gate line SGD, and the like is small. Thus, current consumption can be restricted.

[Soft-Erasing]

The aforementioned erasing operation can be applied to soft-erasing, which is conducted to change the threshold distribution of a memory transistor MTr in an over-programmed state into an appropriate threshold distribution. Here, the over-programmed state represents a state in which an excessive writing operation is performed to cause the threshold distribution of the memory transistor MTr to exceed an allowable range. For example, in a case of holding multiple-valued (4 values: E, A, B, and C) data, a writing operation at level A has been performed to the memory transistor MTr, but when the threshold distribution of the memory transistor MTr exceeds an allowable range, and an excessive writing operation is performed to have a threshold voltage at level B, for example, data is possibly read erroneously.

However, by conducting soft-erasing of the present embodiment to the over-programmed memory transistor MTr, erroneous data reading can be reduced.

More specifically, the over-programmed state means a state in which an upper limit voltage Vth of the threshold voltage distribution of the memory transistor is higher than a predetermined allowable voltage Vmax. Soft-erasing means an operation in which the threshold voltage distribution is shifted so that the upper limit of the threshold voltage distribution of the memory transistor may be below the allowable voltage Vmax.

Figure 14:
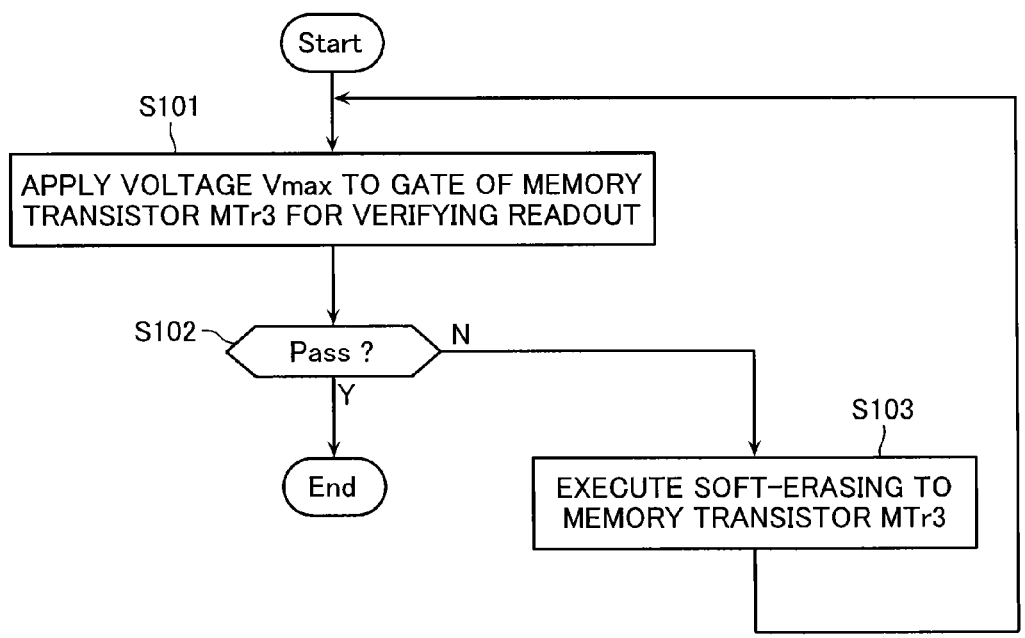
FIG. 14 is a timing chart illustrating soft-erasing according to the first embodiment.

For example, the soft-erasing is executed as a flowchart shown in FIG. 14. In the example shown in FIG. 14, the soft-erasing shall be executed to the selected memory transistor MTr3 in the selected memory unit MU(1, 1). First, verifying readout is executed to the memory transistor MTr3 (step S101).

At step S101, the verifying readout to the selected memory transistor MTr3 is executed in the following manner, for example. That is, the bit line BL1 is first charged to reach a predetermined voltage, and the source line SL is grounded (GND). The drain-side select transistor SDTr, the source-side select transistor SSTr, and the non-selected memory transistors MTr1, MTr2, MTr4 to MTr8 are in conductive states. The gate of the selected memory transistor MTr3 is applied thereto an allowable voltage Vmax. In a case where current having a predetermined value or higher flows from the bit line BL to the source line SL in such a state (Pass), it is determined that an upper limit voltage Vth of the threshold voltage distribution of the selected memory transistor MTr3 is less than the allowable voltage Vmax, and that the selected memory transistor MTr3 is in an appropriate writing state. On the other hand, in a case where current having the predetermined value or higher does not flow from the bit line BL to the source line SL, it is determined that the voltage Vth is higher than the allowable voltage Vmax, and that the selected memory transistor MTr3 is in an over-programmed state.

Subsequently, when it is determined by the verifying operation at step S101 that the memory transistor MTr3 is in an over-programmed state (step S102, N), the soft-erasing is executed selectively to the memory transistor MTr3 (step S103), and step S101 is thereafter executed. On the other hand, when it is determined by the verifying operation at step S101 that the memory transistor MTr3 is not in an over-programmed state (step S102, Y), the processing ends.

According to the present embodiment, the soft-erasing at step S103 is executed selectively to the memory transistor MTr3 contained in the selected memory unit MU(1, 1) in the selected memory block MB(1) and is not executed to the other memory transistors MTr.

Meanwhile, a conventional erasing operation employs a method of performing erasure to all the memory transistors MTr contained in the memory block MB(1) at a time. However, in a case where such an erasing operation is adopted in the soft-erasing, data of all the memory transistors MTr contained in the selected memory block MB(1) are erased at a time, and a writing operation is thereafter performed again selectively to the memory transistors MTr. That is, data of all the memory transistors MTr contained in the non-selected memory block MB do not need to be erased. As a result, the nonvolatile semiconductor memory device of the present embodiment can shorten operating time as much as time for erasing data of all the memory transistors MTr contained in the non-selected memory block MB, compared with the conventional one.

[Second Embodiment]

[Configuration]

Next, the nonvolatile semiconductor memory device according to a second embodiment will be described. Description of a configuration of the second embodiment is not repeated here since the second embodiment is configured in a similar manner to that of the first embodiment. The second embodiment differs from the first embodiment in terms of an erasing operation described below.

[Erasing Operation]

Figure 15:
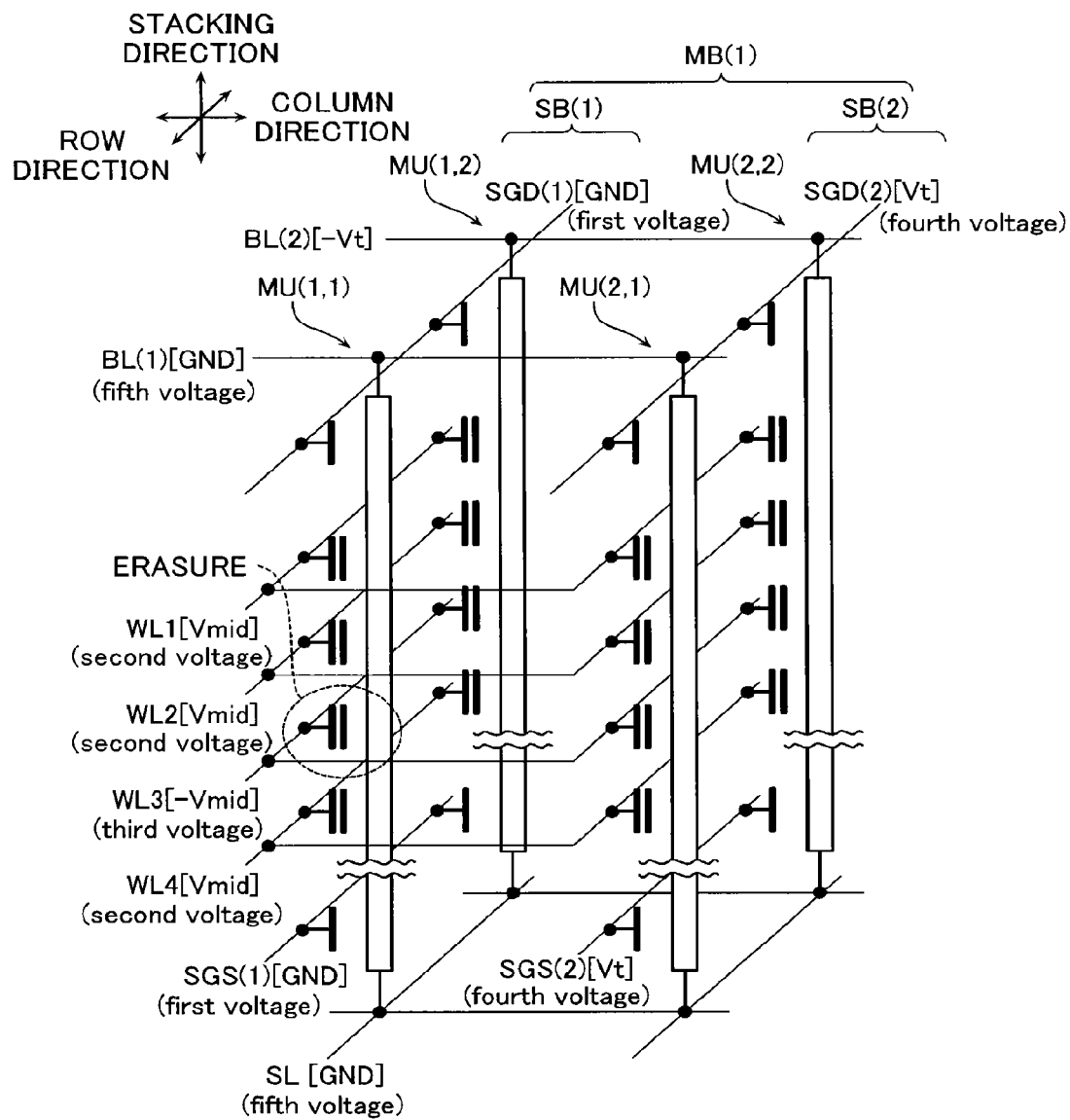
FIG. 15 schematically illustrates an erasing operation according to a second embodiment.

Referring to FIG. 15, an erasing operation of the nonvolatile semiconductor memory device according to the second embodiment will be described. In the second embodiment, voltages to be applied to various wires in the erasing operation are different from those of the first embodiment. It is to be noted that description of a configuration of the second embodiment is not repeated here since the second embodiment is configured in a similar manner to that of the first embodiment.

As shown in FIG. 15, in the second embodiment, the drain-side select gate line SGD(1) and the source-side select gate line SGS(1) are grounded (GND). The drain-side select gate line SGD(2) and the source-side select gate line SGS(2) are applied thereto the voltages Vt. The selected word line WL3 is applied thereto voltage—Vmid. The non-selected word lines WL1, WL2, and WL4 to WL8 are applied thereto the voltages Vmid. The bit line BL(1) and the source line SL are grounded (GND), and the bit line BL(2) is applied thereto voltage–Vt.

By the voltage relations shown in FIG. 15, the second embodiment can execute the erasing operation selectively to one selected memory transistor MTr3 in the selected memory unit MU(1, 1) in a similar manner to that of the first embodiment.

[Other Embodiments]

While certain embodiments of the inventions have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

For example, in the selected memory block MB, the voltages applied to the wirings SL, BL, SGS, SGD, WL1 to WL8, and BG are not limited to the voltages shown in FIG. 7A or FIG. 15, and need only have a relative relation of the voltages shown in FIG. 7A or FIG. 15.

What is claimed is:

1. A nonvolatile semiconductor memory device comprising:
   a semiconductor substrate;
   a memory cell array comprising a memory string including a plurality of memory cells, the memory cells being stacked above the semiconductor substrate;
   a plurality of word lines electrically connected to the plurality of memory cells;
   a bit line electrically connected to one end of the memory string;
   a source line electrically connected to the other end of the memory string;
   a drain-side select transistor electrically connected to both one end of the memory string and the bit line;
   a source-side select transistor electrically connected to both the other end of the memory string and the source line; and
   a control circuit configured to perform an erase operation, the erase operation including a first phase and a second phase performed after the first phase,
   the control circuit being configured to perform the erase operation on the condition that a first voltage is applied to at least one of a gate of the drain-side select transistor and a gate of the source-side select transistor in a selected memory string during the first phase and the second phase, a second voltage is applied to a first word line during the second phase, and a third voltage is applied to a second word line during the second phase, the first word line being electrically connected to a gate of a first memory cell in the selected memory string, the second word line being electrically connected to a gate of a second memory cell in the selected memory string, and the third voltage being smaller than the second voltage.

2. The nonvolatile semiconductor memory device according to claim 1, further comprising:
   a drain-side select gate line electrically connected to the gate of the drain-side select transistor; and
   a source-side select gate line electrically connected to the gate of the source-side select transistor,
   wherein,
   in a first non-selected memory string electrically connected to the bit line and the source line in common with the selected memory string, the control circuit is configured to apply a fourth voltage to at least one of the drain-side select gate line and the source-side select gate line.

3. The nonvolatile semiconductor memory device according to claim 2, wherein the control circuit is configured to apply a fifth voltage to the bit line and the source line, and
   wherein the fifth voltage is set to a value that prevents data held in a memory cell from being changed when the fifth voltage is applied to the semiconductor layer, and the second voltage is applied to the first word line.

4. The nonvolatile semiconductor memory device according to claim 2, wherein the control circuit is configured to apply a fifth voltage to the bit line and the source line, and
   wherein the fifth voltage is set to a value that prevents data held in a memory cell from being changed when the fifth voltage is applied to the semiconductor layer, and the third voltage is applied to the second word line.

5. The nonvolatile semiconductor memory device according to claim 3, wherein the fifth voltage is set to a value that prevents data held in a memory cell from being changed when the fifth voltage is applied to the semiconductor layer, and when the third voltage is applied to the second word line.

6. The nonvolatile semiconductor memory device according to claim 1, wherein the erase operation comprises a soft-erase operation, the soft-erase operation being performed after a writing operation.

7. The nonvolatile semiconductor memory device according to claim 1, wherein the control circuit raises a voltage of the first word line to the second voltage in several stages.

8. The nonvolatile semiconductor memory device according to claim 2, wherein the second voltage and the fourth voltage are positive voltages, the third voltage is negative voltage, and the first voltage is ground voltage.

9. The nonvolatile semiconductor memory device according to claim 2, wherein the second voltage, the first voltage, and the fourth voltage are positive voltages, and the third voltage is a ground voltage.

10. The nonvolatile semiconductor memory device according to claim 1, wherein the memory cell comprises:
    a first semiconductor layer;
    a charge accumulation layer surrounding the first semiconductor layer; and
    a first conductive layer surrounding the charge accumulation layer.

11. The nonvolatile semiconductor memory device according to claim 1, wherein the control circuit is configured to set the drain-side select transistor and the source-side select transistor in the selected memory string to non-conductive states by applying the first voltage.

12. A method for erasing data of a nonvolatile semiconductor memory device, the nonvolatile semiconductor memory device including:

a semiconductor substrate;

a memory cell array comprising a memory string comprising a plurality of memory cells, the memory cells being stacked above the semiconductor substrate;

a plurality of word lines electrically connected to the plurality of memory cells;

a bit line electrically connected to one end of the memory string;

a source line electrically connected to the other end of the memory string;

a drain-side select transistor electrically connected to both one end of the memory string and the bit line; and a source-side select transistor electrically connected to both the other end of the memory string and the source line, the method comprising performing an erase operation, the erase operation including a first phase and a second phase performed after the first phase, applying a first voltage to at least one of a gate of the drain-side select transistor and a gate of the source-side select transistor in a selected memory string during the first phase and the second phase, applying a second voltage to a first word line during the second phase, and applying a third voltage to a second word line during the second phase, the first word line being electrically connected to a gate of a first memory cell in the selected memory string, the second word line being electrically connected to a gate of a second memory cell in the selected memory string, and the third voltage being smaller than the second voltage.

13. The method for erasing data of a nonvolatile semiconductor memory device according to claim 12, the nonvolatile semiconductor memory device further including:

a drain-side select gate line electrically connected to the gate of the drain-side select transistor; and a source-side select gate line electrically connected to the gate of the source-side select transistor, wherein, in a first non-selected memory string electrically connected to the bit line and the source line in common with the selected memory string, the method applies a fourth voltage to at least one of the drain-side select gate line and the source-side select gate line.

14. The method for erasing data of a nonvolatile semiconductor memory device according to claim 13, wherein the method applies a fifth voltage to the bit line and the source line, and wherein the fifth voltage is set to a value that prevents data held in a memory cell from being changed when the fifth voltage is applied to the semiconductor layer, and the second voltage is applied to the first word line.

15. The method for erasing data of a nonvolatile semiconductor memory device according to claim 13, wherein the method applies a fifth voltage to the bit line and the source line, and wherein the fifth voltage is set to a value that prevents data held in a memory cell from being changed when the fifth voltage is applied to the semiconductor layer, and the third voltage is applied to the second word line.

16. The method for erasing data of a nonvolatile semiconductor memory device according to claim 14, wherein the fifth voltage is set to a value that prevents data held in a memory cell from being changed when the fifth voltage is applied to the semiconductor layer, and the third voltage is applied to the second word line.

17. The method for erasing data of a nonvolatile semiconductor memory device according to claim 12, wherein the erase operation includes a soft-erase operation, the soft-erase operation being performed after a writing operation.

18. The method for erasing data of a nonvolatile semiconductor memory device according to claim 12, wherein a voltage of the first word line is raised to the second voltage in several stages.

* * * * *